US006836421B2

(12) United States Patent
Rinerson et al.

(10) Patent No.: US 6,836,421 B2
(45) Date of Patent: Dec. 28, 2004

(54) LINE DRIVERS THAT FIT WITHIN A SPECIFIED LINE PITCH

(75) Inventors: Darrell Rinerson, Cupertino, CA (US); Christophe J. Chevallier, Palo Alto, CA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 71 days.

(21) Appl. No.: 10/613,099

(22) Filed: Jul. 1, 2003

(65) Prior Publication Data

US 2004/0160849 A1 Aug. 19, 2004

Related U.S. Application Data

(60) Provisional application No. 60/400,849, filed on Aug. 2, 2002, provisional application No. 60/422,922, filed on Oct. 31, 2002, and provisional application No. 60/424,083, filed on Nov. 5, 2002.

(51) Int. Cl.⁷ .............................................. G11C 5/02
(52) U.S. Cl. ...................... 365/51; 365/63; 365/230.06
(58) Field of Search ....................... 365/230.06, 230.07, 365/51, 63, 72

(56) References Cited

U.S. PATENT DOCUMENTS

| 4,442,507 A | 4/1984 | Roesner ...................... 365/100 |
| 5,835,396 A | 11/1998 | Zhang .......................... 365/51 |
| 5,920,500 A | 7/1999 | Tehrani et al. ............... 365/173 |
| 6,034,882 A | 3/2000 | Johnson et al. ............. 365/103 |
| 6,185,122 B1 | 2/2001 | Johnson et al. ............. 365/103 |
| 6,204,139 B1 | 3/2001 | Liu et al. .................... 438/385 |
| 6,351,406 B1 | 2/2002 | Johnson et al. ............. 365/103 |
| 6,385,074 B1 | 5/2002 | Johnson et al. ............. 365/103 |
| 6,483,736 B2 | 11/2002 | Johnson et al. ............. 365/130 |
| 6,504,753 B1 | 1/2003 | Scheuerlein et al. ........ 365/175 |
| 6,545,891 B1 | 4/2003 | Tringali et al. ............... 365/51 |
| 6,657,885 B2 * | 12/2003 | Kuriyama et al. .......... 365/154 |
| 2001/0023992 A1 | 9/2001 | Doll ........................... 257/777 |
| 2002/0000597 A1 | 1/2002 | Okazawa .................... 257/298 |
| 2002/0067636 A1 * | 6/2002 | Kuriyama et al. .......... 365/154 |

OTHER PUBLICATIONS

Beck, A. et al., "Reproducible switching effect in thin oxide films for memory applications", Applied Physics Letters, vol. 77, No. 1, Jul. 3, 2000, 139–141.

Rossel, C. et al., "Electrical current distribution across a metal–insulator–metal structure during bistable switching", Journal of Applied Physics, vol. 90, No. 6, Sep. 15, 2001, 2892–2898.

Watanabe, Y. et al., "Current–driven insulator–conductor transition and nonvolatile memory in chromium–doped $SrTiO_3$ single crystals", Applied Physics Letters, vol. 78, No. 23, Jun. 4, 2001, 3738–3740.

* cited by examiner

Primary Examiner—Andrew Q. Tran
(74) Attorney, Agent, or Firm—Beyer Weaver & Thomas, LLP

(57) ABSTRACT

Line drivers that fit within a specified line pitch. One method of placing line drivers completely underneath a cross point array requires splitting the line driver up so that a portion of the line drivers is on a first side of the cross point array and the other portion is on the opposite side. However, using this technique requires that the width of the drivers is no larger than the width of the memory cells that are being driven. This can be accomplished by stacking transistors such that line drivers fit within a specified line pitch, but are as long as is necessary to include all the necessary circuit.

21 Claims, 24 Drawing Sheets

LINE DRIVERS THAT FIT WITHIN A SPECIFIED LINE PITCH

CROSS-REFERENCE TO RELATED APPLICATIONS

This application claims the benefit of U.S. Provisional Application No. 60/400,849, filed Aug. 2, 2002, the U.S. Provisional Application No. 60/422,922, filed Oct. 31, 2002, and the U.S. Provisional Application No. 60/424,083, filed Nov. 5, 2002, all of which are incorporated herein by reference in their entireties and for all purposes. This application is related to the following U.S. Patent Applications: U.S. application Ser. No. 10/360,005, filed Feb. 7, 2003; U.S. application Ser. No. 10/330,512, filed Dec. 26, 2002; application Ser. No. 10/330,153, filed Dec. 26, 2002; application Ser. No. 10/330,964, filed Dec. 26, 2002; application Ser. No. 10/330,170, filed Dec. 26, 2002; application Ser. No. 10/330,900, filed Dec. 26, 2002; application Ser. No. 10/330,150, filed Dec. 26, 2002; application Ser. No. 10/330,965, filed Dec. 26, 2002; and the applications that are titled "Layout Of Driver Sets In A Cross Point Memory Array," "RAM With Multiple Memory Layers Using Shared Logic," "Cross Point Memory Array With Fast Access Time," and "Line Drivers That Use Minimal Metal Layers," all of which are filed on date herewith. All of the above applications are hereby incorporated herein by reference in their entireties and for all purposes.

BACKGROUND OF THE INVENTION

1. Field of the Invention

The present invention relates generally to memory, and more specifically to memory employing a cross point array.

2. Description of the Related Art

A random access memory ("RAM") type of memory is typically associated with the main memory available to computer programs and similar devices. RAM type memory is often contrasted with a read-only memory ("ROM") type of memory, which is typically associated with a special memory that is either not changed, or changed relatively infrequently. RAM mostly comprises SRAM and DRAM. ROM mostly comprises Flash memory, EPROM, OTP, EEPROM, PROM and ROM. Some devices such as NovRAM and Battery powered SRAM are hybrid devices using more than one technology.

Although SRAM is the memory of choice for computer applications, with very fast access times, its volatility, large size and stand-by current limit the total size and applications of the memory. Nonvolatile memories such as Flash memory are slower to program, and in some case must be erased a large block at a time before being reprogrammed. DRAM has the smallest cell size, but necessitates a complex refresh algorithm, and is volatile. For new applications, away from PC applications and into portable applications such as cell phones, personal digital assistants (PDA), digital cameras, camcorders, removable "key-chain" or "USB" disks, the key issues are nonvolatility and low power consumption.

Regardless of how the memory is used, RAM and ROM overlap in many respects. Both types of memory can allow random access reads. Both types of memory can be relatively fast or relatively slow. Although all ROMs are non-volatile, so are some RAMs. Although most ROMs cannot change their data once programmed, some ROMs can be re-programmed. RAM, however, is always re-writable.

The ROMs that are capable of modifying their data typically require long write cycles that erase entire blocks of data prior to new data being written. For example, UV light might be applied to an entire memory block in order to "repair" fused connections so that the block can be re-written with new data. RAM, on the other hand, can read or write to a randomly accessed byte of memory, typically performing either operation in a standard cycle.

Conventional nonvolatile RAM and ROM require three terminal MOSFET-based devices. The layout of such devices are not ideal, usually requiring feature sizes of at least $8f^2$ for each memory cell, where f is the minimum feature size.

However, not all memory elements require three terminals. Certain complex metal oxides (CMOs), for example, can retain a resistive state after being exposed to an electronic pulse, which can be generated from two terminals. U.S. Pat. No. 6,204,139, issued Mar. 20, 2001, to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

Similarly, the IBM Zurich Research Center has also published three technical papers that also discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

Similarly, magnetic RAM (MRAM) requires only two terminals to deliver a magnetic field to the memory element. Other two terminal devices include Ovonic Unified Memory (OUM), which uses chalcogenic layers of material, and various types of ferroelectric memory. With only two terminals, it has been theorized that memory can be arranged in a cross point architecture.

However, mere recognition that a two terminal memory element is theoretically capable of being placed in a cross point array does not solve many of the non-trivial problems associated with actually creating such a device.

SUMMARY OF THE INVENTION

The present invention provides a driver set that fits within a specified line pitch. The driver set includes a semiconductor substrate, a plurality of line driver groups, and a plurality of conductive lines. Each line driver group is formed on the substrate and has N line drivers. Each conductive line are electrically connected to both a line driver and a plurality of memory cells, each memory cell being fabricated to a width W. The line driver group has a width that is not greater than NxW.

Another aspect of the invention is expressed with circuitry that includes a plurality of line driver groups, a primary decoder, a secondary decoder, and a memory array. The line driver groups are stacked in a first direction, each line driver group being in one of N positions and controlling one of N contiguous lines. The primary decoder is electrically connected to the plurality of line driver groups and is capable of selecting a single line driver group from the plurality of line driver groups. The secondary decoder is electrically connected to the line driver groups and is capable of selecting all the line drivers that are in a selected position from among the N positions. The size of the plurality of line driver groups in the first direction is less than or substantially the same as the size of the memory array in the first direction.

BRIEF DESCRIPTION OF THE DRAWINGS

The invention may best be understood by reference to the following description taken in conjunction with the accompanying drawings, in which.

It is to understood that, in the drawings, like reference numerals designate like structural elements. Also, it is understood that the depictions in the figures are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Overview

The random access reads and writes that are required for RAM devices typically require that a particular memory cell be capable of being selected out of an entire memory block.

For a two terminal memory cell in a cross point structure, that usually means that both terminals are used for selection. Since one of the terminals is common to an entire row of memory cells and another terminal is common to an entire column of memory cells in a cross point array, writing with a single terminal would result in writing to either an entire row or an entire column. Therefore, a single cross point array would typically have both an x-direction driver set and a y-direction driver set.

Compared to a memory cell in a cross point array, driver sets are fairly large, typically requiring several transistors to drive a single column or row. Although the cross point array can be fabricated over all the driver circuitry, placing the drivers underneath the cross point array while conserving space is not a trivial matter. One technique that can be used to ensure an efficient use of space is by splitting the line driver up so that a portion is on a first side of the cross point array and the other portion is on the opposite side. However, using this technique requires that the width of the driver is no larger than the width of the memory cells that are being driven.

The Cross Point Array

Figure 1:
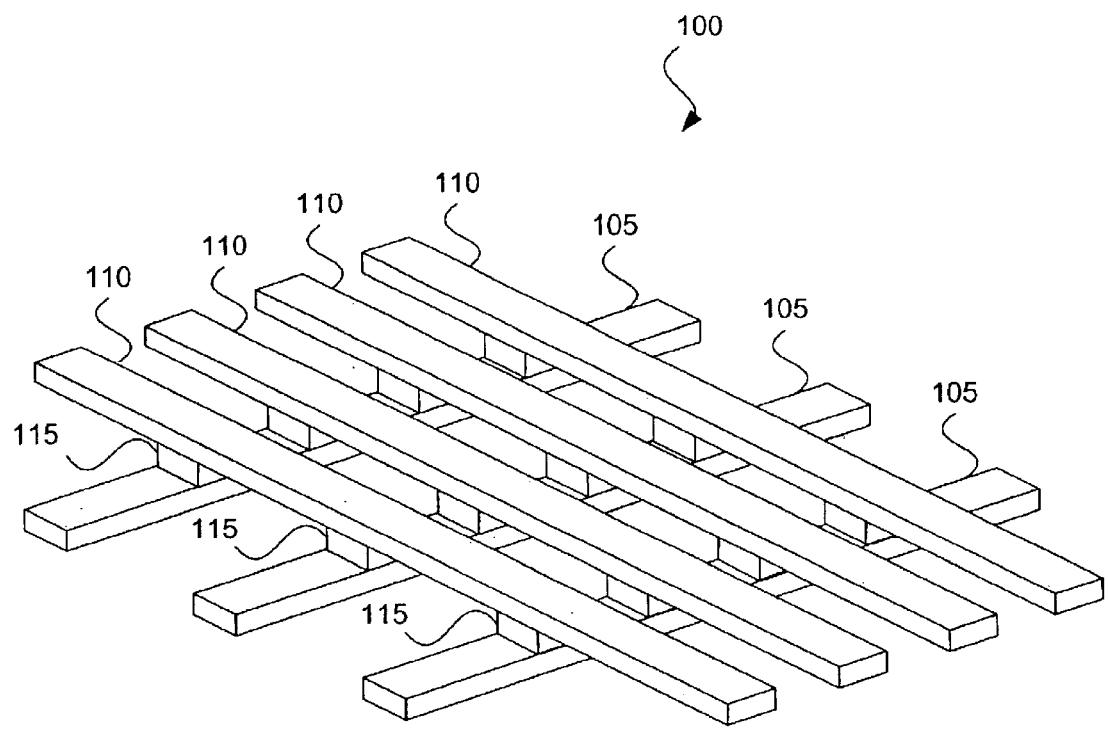
FIG. 1 depicts a perspective view of an exemplary cross point memory array employing a single layer of memory.

FIG. 1 depicts an exemplary cross point array 100 employing a single layer of memory. A bottom layer of x-direction conductive array lines 105 is orthogonal to a top layer of y-direction conductive array lines 110. A plurality of memory plugs 115 are located at the intersections of the conductive array lines, each individual memory plug being capable of being uniquely identified and, therefore, uniquely selected by a single x-direction conductive array line and a single y-direction conductive array line.

Conductive array line layers 105 and 110 can be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

The memory plug layer 115 will typically dictate the requirements of at least the conductive array line layer 105 beneath the memory plug layer 115. Certain fabrication process (e.g., solution based spin on followed by high temperature anneal, pulsed laser deposition, sputtering, and metalorganic chemical vapor deposition) might require that refractory metals be used for conductive array lines so that they may withstand the high temperature fabrication process. However, refractive array lines have higher resistances, which means that a given x-direction conductive array line would not be able to timely access as many memory plugs as a lower resistance conductive array line, reducing the number of memory cells on the cross-point array 100.

Each memory plug in the memory plug layer 115 contains a memory element along with any other materials that may be necessary. The additional materials might include a non-ohmic device, as is described in co-pending application "High Density NVRAM," U.S. application Ser. No. 10/360, 005, filed Feb. 7, 2003, already incorporated by reference. The non-ohmic device exhibits a very high resistance regime for a certain range of voltages ($V_{NO-}$ to $V_{NO+}$) and a very low resistance regime for voltages above and below that range. Together, the memory element and the non-ohmic device cause the memory plug to exhibit a non-linear resistive characteristic.

Figure 2:
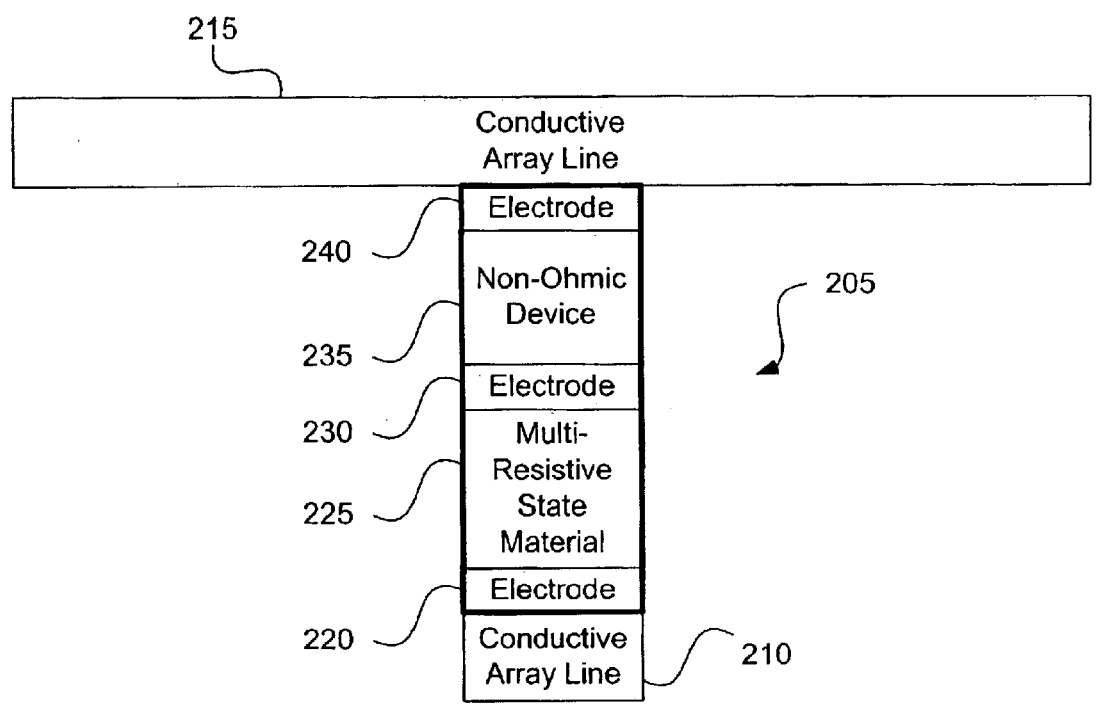
FIG. 2 depicts a side view of an exemplary memory plug with five layers and sandwiched between two conductive array lines.

FIG. 2 depicts a side view of an exemplary memory plug 205 with five layers and sandwiched between two conductive array lines 210 and 215. The five layers are: a first electrode layer 220, a layer of multi-resistive state material 225, a second electrode layer 230, a layer making up the non-ohmic device 235, and a third electrode 240. Some layers may actually be made up of multiple thin films. For example, one type of non-ohmic device 235 uses a three film metal-insulator-metal (MIM) structure. Additionally, not all the layers are required for every memory plug 205 configuration. For example, certain cross point arrays may use means other than the non-ohmic device 235 to prevent unselected memory plugs from being disturbed.

Typical electrodes 220, 230 and 240 commonly used in fabrication include Pt, Au, Ag and Al. If the only purpose of the electrodes 220, 230 and 240 is as a barrier to prevent metal inter-diffusion, then a thin layer of metal, e.g. TiN, could be used. If a seed layer is additionally required, any number of electrically conductive materials can be used for on top of the thin layer of metal. For example, the seed layer could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN. It will be appreciated that the choice of electrode layers 220, 230 and 240 in combination with the multi-resistive state material layer 225 may affect the properties of the memory element. As such, the memory function is realized either by the multi-resistive state material 225 properties or by the interface between an electrode 220 or 230 and the multi-resistive state material 225.

The multi-resistive state material 225 will generally be a crystalline or polycrystalline structure. One class of multi-resistive state material 225 are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state material 225 for use in the memory plug 205. The compounds that make up this class of multi-resistive state materials 225 include both normal conductive metal oxides and conductive complex metal oxides.

Multi-resistive state materials 225, however, are not limited to perovskites. Specifically, any material that uses trapped charges to modify or alter conductivity could be used in the memory plug 205. Doping different materials (e.g., insulators, conductors, conductive oxides, and/or polymers), for example, may create charge traps by substituting the dopant for crystalline elements. Doping may also be used to create charge traps by interstitially introducing dopants into a crystalline structure. Also, introducing separate physical clusters, or groups of atoms, into a crystalline structure may create charge traps as well.

While the resistance changing effect of the multi-resistive state material 225 is generally not dependent upon its area or its thickness, the resistance value of the multi-resistive state material 225 is dependant on both its area and its thickness as well as other properties. Similarly, the voltage at which multi-resistive state material 225 switches resistive states is also dependent upon the various properties of the material.

The various properties of the multi-resistive state material 225 will determine both the lowest possible resistance state and the highest possible resistive state. Although the highest operational resistive state ($R_0$) of the memory plug 205 does not need to be its highest possible state and the lowest operational resistance state ($R_1$) does not need to be its lowest possible state, designs can set $R_0$ and $R_1$ close to those states for simplicity.

When considering an operative value of the $R_1$ resistive state parasitic resistances that are in series with the memory plug must also be considered. Sources of resistance include the contacts and the vias, the metal interconnect lines, and the driver circuits. Parasitic resistances might total 100–200 $\Omega$, which puts a lower limit on the memory plug resistance. While the parasitic resistance may be overcome through more complicated circuit design, such designs typically result in loss of access time, or a larger die size.

The $R_1$ state of the memory plug may have a best value of 10 k$\Omega$ to 100 k$\Omega$. If the $R_1$ state resistance is much less than 10 k$\Omega$, the current consumption will be increased because the cell current is high, and the parasitic resistances will have a larger effect. If the $R_1$ state value is much above 100 k$\Omega$, the RC delays will increase access time. However, workable single state resistive values may also be achieved with resistances as low as 5 k$\Omega$ and as high as 1 M$\Omega$. Typically, a single state memory would have the operational voltages of $R_0$ and $R_1$ separated by a factor of 10.

For example, if 1 volt were used as a read voltage ($V_R$), $R_1$ might be about 100 k$\Omega$ and $R_0$ might be about 1 M$\Omega$, making the current either 1 $\mu$A or 1 $\mu$A, depending on the resistive state. Since large currents can be destructive to semiconductors fabricated to small dimensions, no more than 10 $\mu$A would be desired for a memory circuit in most cases. Once a $V_R$ is identified, a desired write voltage ($V_W$) can also be determined. Not only should $V_W$ be greater than $V_R$, but it should also be far enough away from $V_R$ to allow minor voltage fluctuations (e.g., due to fabrication imperfections) to have a negligible effect on the multi-resistive state material 225. Similarly, $V_W$ should be greater than $V_{Wth}$, the threshold at which the resistive material starts to change resistivity, for the same reason. A typical $V_W$ might be about 2 volts, and $V_{Wth}$ might be about 1.5 volts.

Figure 3A:
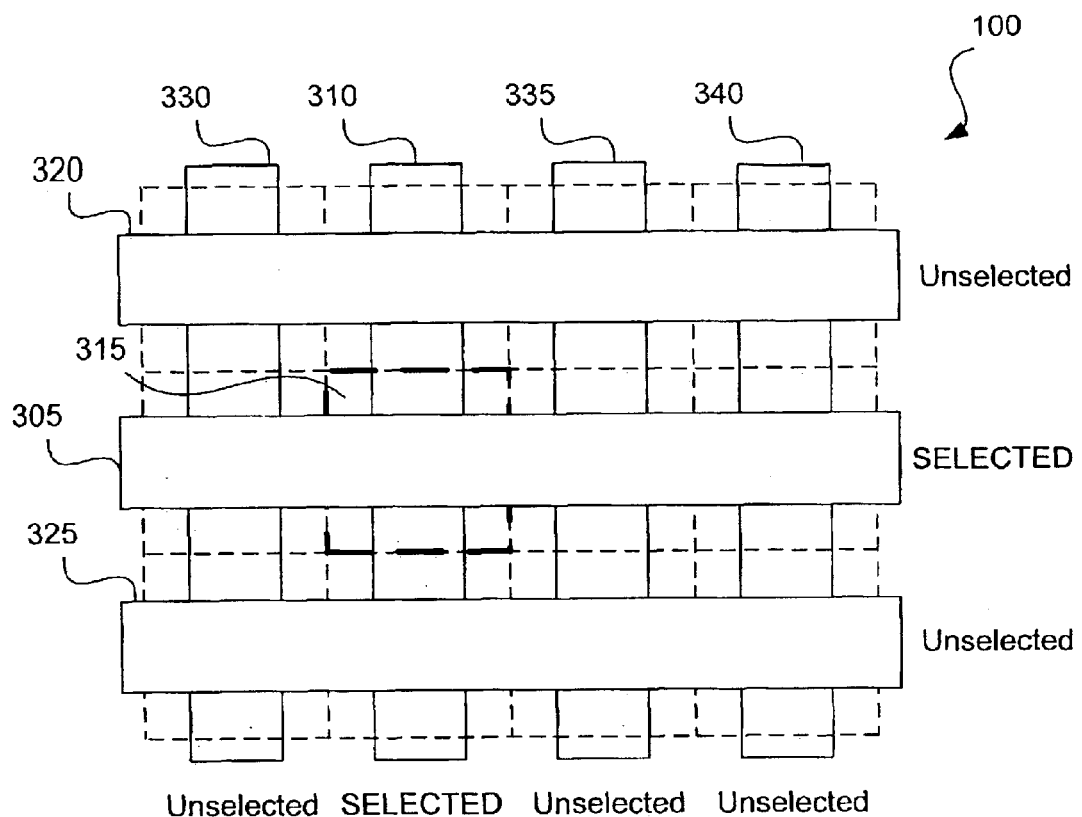
FIG. 3A illustrates selection of a memory cell in the cross point array depicted in FIG. 1.
Figure 3B:
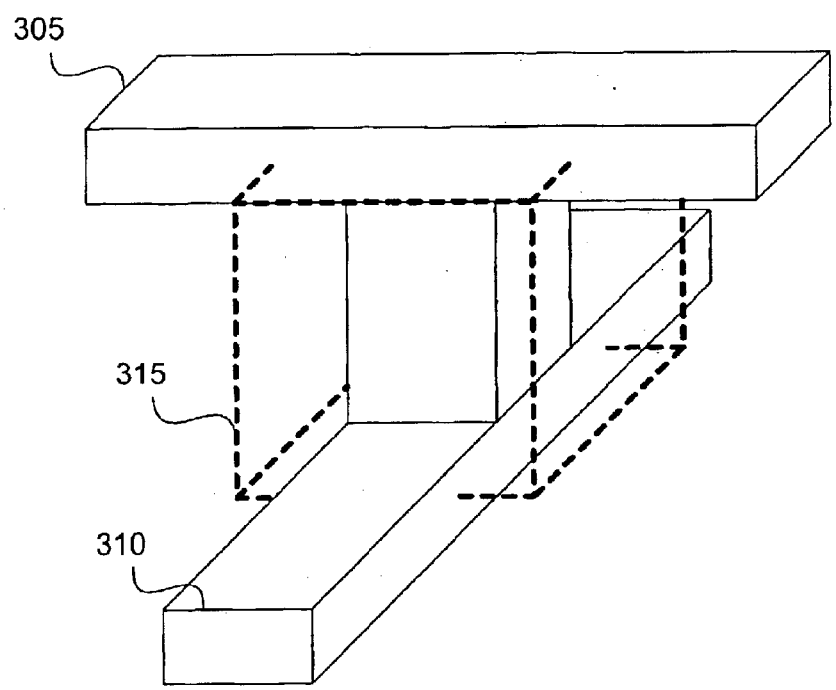
FIG. 3B illustrates the boundaries of the selected memory cell of FIG. 3A.

The properties of the non-ohmic device 235 would then be dependant on ½ $V_R$. FIG. 3A illustrates selection of a memory cell 315 in the cross point array 100. The point of intersection between a single x-direction conductive array line 305 and a single y-direction conductive array line 310 uniquely identifies a single memory cell 315. FIG. 3B illustrates the boundaries of the selected memory cell 315. The memory cell a repeatable unit that can be theoretically extended in all dimensions. In certain embodiments, the memory cells are repeated in the z direction (orthogonal to the x-y plane). A preferred method of repeating the memory cells in the z-direction is to use both the bottom and top surfaces of conductive array lines that sandwich memory plugs layers. Therefore, the repeatable cell that makes up the array of memory cells can be considered to be a memory plug, plus ½ of the space around the memory plug, plus ½ of an x-direction conductive array line and ½ of a y-direction conductive array line. Of course, ½ of a conductive array line is merely a theoretical construct, since a conductive array line would generally be the same width, regardless of whether both surfaces of the conductive array line was used. Accordingly, the very top and very bottom layers of conductive array lines (which use only one surface) would typically be fabricated to the same size as all other layers of conductive array lines.

During selection the selected conductive array lines 305 and 310 deliver a voltage to every memory cell associated with those conductive array lines. Therefore, the non-ohmic device must be able to pass current from the minimum voltage seen on a selected memory cell 315 but block at least some current to unselected memory cells. If each conductive array line 305 and 310 supplies half the required voltage of each operation, then ½ $V_W'$ would be the maximum voltage on a single conductive array line and $V_R'$ would be the minimum voltage seen on a selected memory cell 315. $V_W'$ is $V_W$ plus all other voltage drops in the memory cell 315 (e.g., the voltage drop across the non-ohmic device $V_{NO+}$) and $V_R'$ is $V_R$ plus all other voltage drops in the memory cell 315. Accordingly, the selection of only one conductive layer is not sufficient to access a single memory cell array for writing purposes. In embodiments where ½ $V_R'$ is applied by both conductive array lines, the selection of a single conductive layer is also not sufficient to access a single memory layer for reading purposes. However, some decoding circuitry might supply the full read voltage from one conductive array line, then read data from the entire memory layer and simply discard data from unwanted lines.

It should be noted that changes in the resistive property of the memory plugs that are greater than a factor of 10 might be desirable in multi-bit resistive memory cells. Generally, adjusting the pulse width and magnitude of the voltage pulses across the multi-resistive state material results in multiple resistive states. Since multi-resistive state material 225 can be placed into several different resistive states, multi-bit resistive memory cells are possible. For example, the multi-resistive state material might have a high resistive state of $R_{00}$, a medium-high resistive state of $R_{01}$, a medium-low resistive state of $R_{10}$ and a low resistive state of $R_{11}$. Since multi-bit memories typically have access times longer than single-bit memories, using a factor greater than a 10 times change in resistance from $R_{11}$ to $R_{00}$ is one way to make a multi-bit memory as fast as a single-bit memory. For example, a memory cell that is capable of storing two bits might have the low resistive state be separated from the high resistive state by a factor of 100. A memory cell that is capable of storing three or four bits of information might require the low resistive state be separated from the high resistive state by a factor of 1000. Typically, the intermediary resistive states in a multi-bit memory would evenly subdivide the resistive range between the high resistive state and the low resistive state on a logarithmic scale. For example, if a memory cell that held three bits of memory had a low resistive state of 10 k$\Omega$, the six intermediary states might have resistive states of about 26.8 k$\Omega$, 72.0 k$\Omega$, 193 k$\Omega$, 518 k$\Omega$, 1.39 M$\Omega$, and 3.73 M$\Omega$. The highest resistive state would then be 10 M$\Omega$, 1000 times the value of the low resistive state. Each optimal resistive state could easily be calculated by using the relationship Log ($R_{110}$)=Log ($R_{111}$)+ Log K; Log ($R_{101}$)=Log ($R_{111}$)+2 Log K; Log ($R_{100}$)=Log ($R_{111}$)+3 Log K; . . . Log ($R_{000}$)=Log ($R_{111}$)+7 Log K, where Log K=(1/7) [Log ($R_{000}$)−Log ($R_{111}$)].

Those skilled in the art will appreciate that the above-described voltages are voltages seen by the memory plug 315, and not necessarily the absolute values of the voltages from ground. For example, placing 10 volts on the selected x-direction conductive array line 305 and 6 volts on the selected y-direction conductive array line 310 would still attain a 4-volt drop across the memory plug 315. If the voltage drop across any single unselected memory plug was to be no more than 3 volts, then unselected conductive array lines 320, 325, 330, 335 and 340 would need to be held somewhere between 7 volts and 9 volts in the above example. An opposite polarity voltage drop would then be attained in the above example whenever the selected x-direction conductive array line 305 was held to a smaller voltage than the selected y-direction conductive array line 310.

In many designs the unselected conductive array lines 320, 325, 330, 335 and 340 would be held at a constant voltage, regardless of whether a read or write operation was being performed. Therefore, if the selected x-direction conductive array line 310 were placed at 12 volts, then the y-direction unselected conductive array lines 320 and 325 would need to be held at 9 volts in the above example in order to keep the maximum voltage drop to 3 volts. If symmetry was desired, a write operation might require the x-direction conductive array line 310 be held to 11 volts, the y-direction conductive array line 305 be held to 5 volts and all the unselected conductive array lines 320, 325, 330, 335 and 340 be held to 8 volts (halfway between the voltages of the two conductive array lines 305 and 310 for both read and write operations).

Ideally, the multi-resistive state material 225 should switch very quickly from one resistive state to another. Typically, anything less than 50 nanoseconds would be an appropriate switching speed for current applications such as mobile phones, PDAs or other portable electronics devices. Additionally, once the multi-resistive state material 225 is placed in a resistive state, it should be able to retain that state for long periods of time. Ideally, the material should retain its resistive state for over ten years. Since the read voltage should not affect the resistive state, repeated application of the read voltage over ten years should not change the resistive state of the multi-resistive state material 225.

Generally, the chemical and materials properties of the multi-resistive state material 225 are selected to meet the electrical specifications set forth above. For example, the material preferably has a resistivity of not greater than about 1 Ω-cm (although 5 Ω-cm may be a workable value), exhibits a change in resistance of at least about 10×, and has this resistance change triggered by the application of a voltage pulse of not longer than about 100 ns duration and not greater than about 10 V in magnitude. In addition, the memory element material should be compatible with the requirements imposed by the general fabrication process of the entire high density RAM.

The Stacked Cross Point Array

Figure 4A:
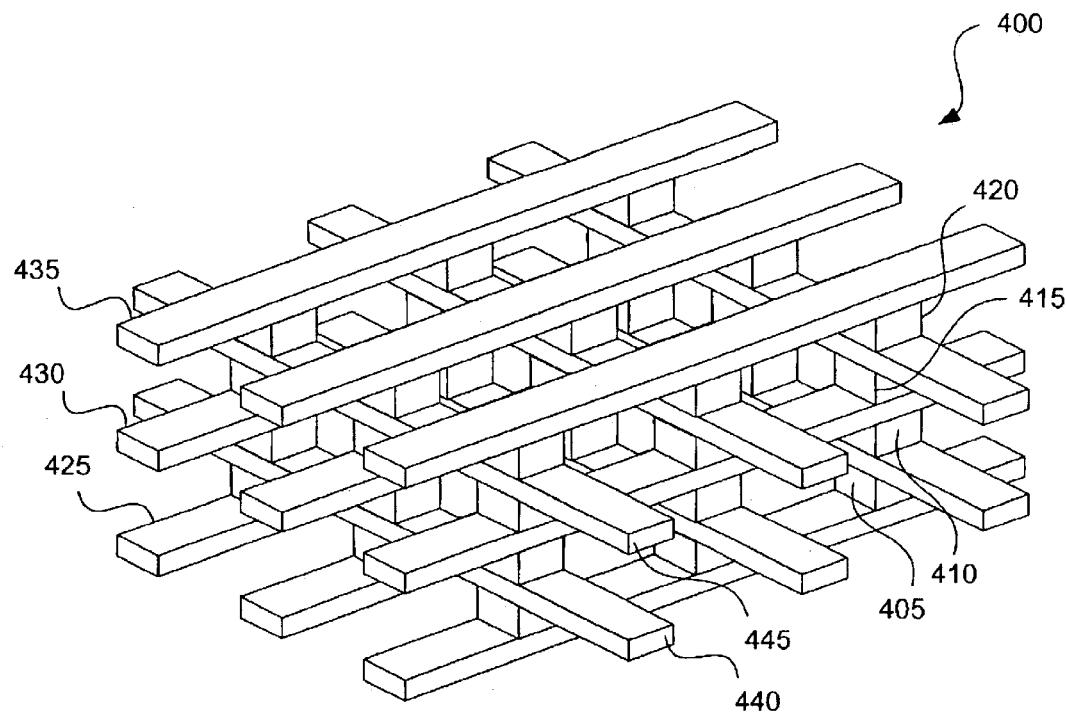
FIG. 4A depicts a perspective view of an exemplary stacked cross point memory array employing four layer of memory.
Figure 4B:
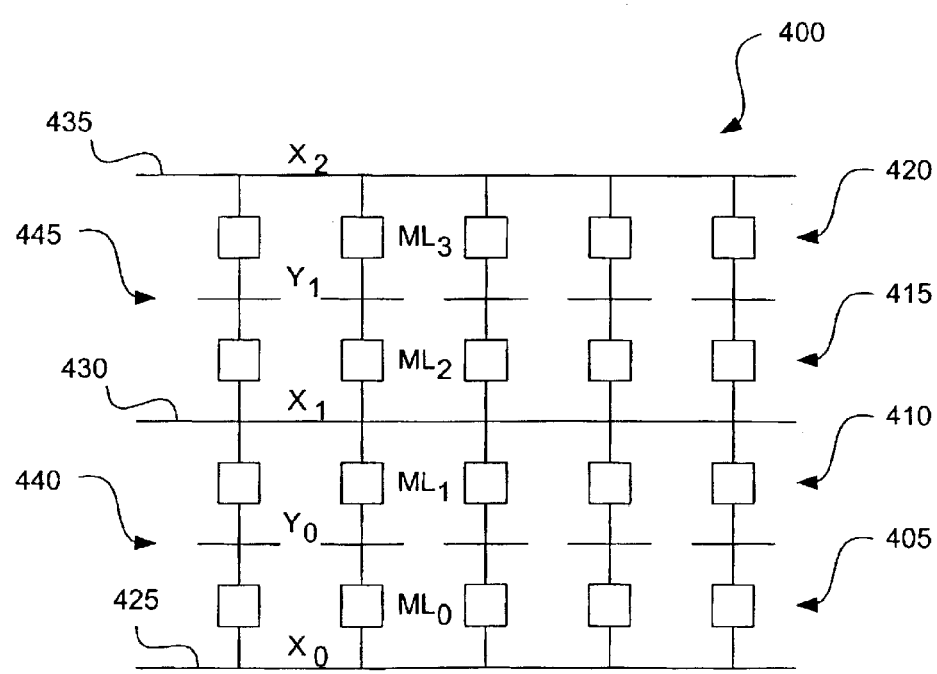
FIG. 4B depicts a schematic diagram of the stacked cross point memory of FIG. 4A.

FIGS. 4A and 4B depict an exemplary stacked cross point array 400 employing four memory layers 405, 410, 415, and 420. The memory layers, $ML_0$ 405, $ML_1$ 410, $ML_2$ 415 and $ML_3$ 420, are sandwiched between alternating layers of x-direction conductive array lines, $X_0$ layer 425, $X_1$ layer 430, and $X_2$ 435, and y-direction conductive array lines, $Y_0$ layer 440 and $Y_1$ layer 445. Stacking multiple memory layers is one technique that can be used increase the memory capacity of a memory device employing a cross point array. Additionally, stacking allows for the memory device to increase its memory capacity without increasing the footprint of the cross point array 400.

Each memory layer 405, 410, 415, and 420 is associated with one layer 425, 430, or 435 of x-direction conductive array lines and one layer 440 or 445 of y-direction conductive array lines. Although the top conductive array line layers 425 and bottom conductive array line layer 435 are only used to supply voltage to a single memory layer 405 and 420, the other conductive array line layers 430, 440, and 445 can be used to supply voltage to both a top and a bottom memory layer 405, 410, 415, or 420.

Generally speaking, if each middle conductive array line layer were used for two memory layers, N memory layers would require N+1 layers of conductive array lines. However, not every conductive line layer would need to have its own separate circuitry. Since selection of a memory plug requires both an x-direction conductive array line and a y-direction conductive array line to be active, multiple conductive array lines in both directions can be activated as long as only one memory layer can be activated.

For example, in the stacked cross point array 400, the top and bottom x-direction layers of conductive array lines (the $X_0$ layer 425 and the $X_2$ layer 435) can be logically related for accessing memory elements, and, in addition to sharing the same selection logic, may even share the same circuitry. Table 1 shows the combinations of x-direction conductive array lines and y-direction conductive array lines that are necessary to activate a memory element on a specific memory layer.

TABLE 1

| $X_0, X_2$ | $X_1$ | $Y_0$ | $Y_1$ | Memory Layer |
|---|---|---|---|---|
| x | | x | | $ML_0$ |
| | x | x | | $ML_1$ |
| | x | | x | $ML_2$ |
| x | | | x | $ML_3$ |

Therefore, in order to access a memory cell on $ML_1$ 410, for example, one conductive array line from the $X_1$ layer 430 and one conductive array line from the $Y_0$ layer 440 would need to be selected.

Activating the appropriate conductive array lines is accomplished through peripheral circuitry. Typically, the peripheral circuitry would be drawn on a semiconductor substrate underneath the stacked cross point memory array 400. Thrus, which are similar to stacked vias, are one mechanism that can be used to reach the peripheral circuitry.

Figure 5:
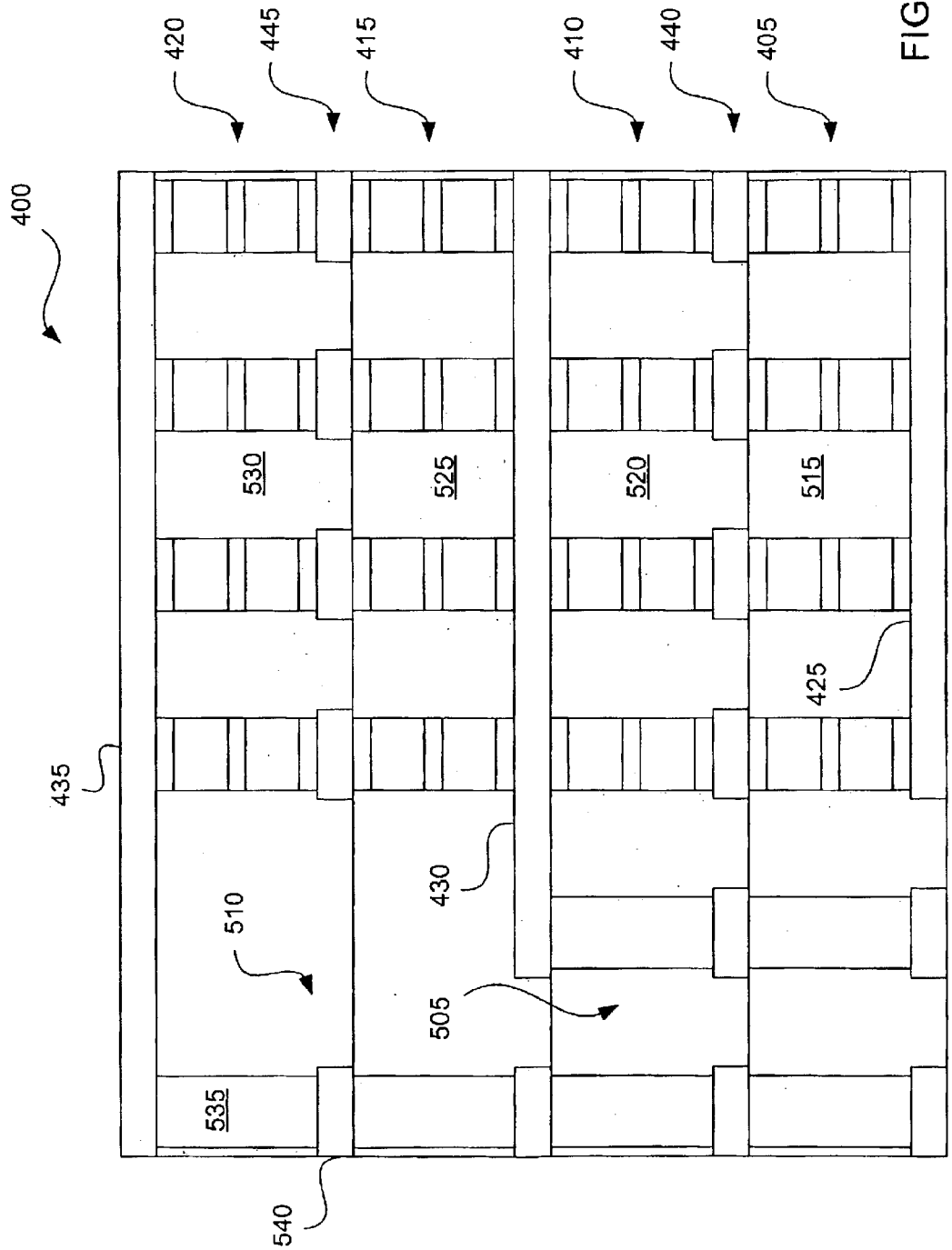
FIG. 5 depicts a cross section of the stacked cross point array of FIG. 4A.

FIG. 5 depicts the exemplary stacked cross point array 400 employing thrus 505 and 510 for the two upper layers of x-direction conductive array lines 430 and 435. As will be appreciated by those skilled in the art, similar thrus could also be used to connect the peripheral circuitry to the y-direction conductive array lines 440 and 445.

The thru 505 that connects the $X_1$ layer 430 to the peripheral circuitry would go through at least two inter-layer dielectric (ILD) layers 515 and 520. ILD layers provide several functions, including preventing capacitive coupling between conductive array lines and providing a substrate for conductive array lines that would otherwise need to span empty spaces.

The thru 510 that connects the $X_2$ layer 435 to the peripheral circuitry would go through at least four ILD layers 515, 520, 525, and 530. Although thrus 505 and 510 may be formed during the same processing steps as the memory layers, a conductive material 535 would need to be used to connect the conductive array lines to the peripheral circuitry.

The Peripheral Circuitry

Figure 6A:
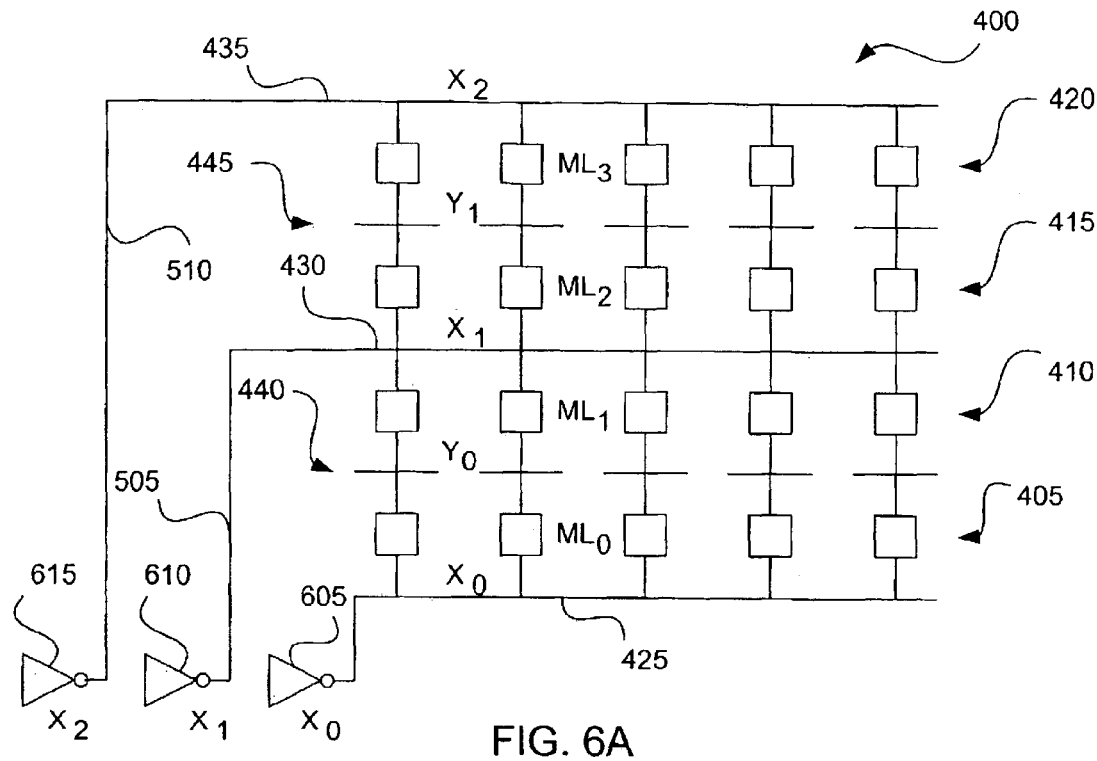
FIG. 6A depicts a schematic diagram of x-direction driver sets in conjunction with the stacked cross point memory of FIG. 4A.

FIG. 6A depicts x-direction driver sets 605, 610, and 615 that are used to select specific x-direction conductive array lines in the $X_0$ layer 425, $X_1$ layer 430, and $X_2$ layer 435. Although the $X_0$ driver 605 and the $X_2$ driver 615 can use identical logic (as described in table 1), separate drivers are shown because of the difficulty in routing the single $X_0$ driver 605 around the thru 505 that connects the $X_1$ layer 430 to the $X_1$ driver 610.

Figure 6B:
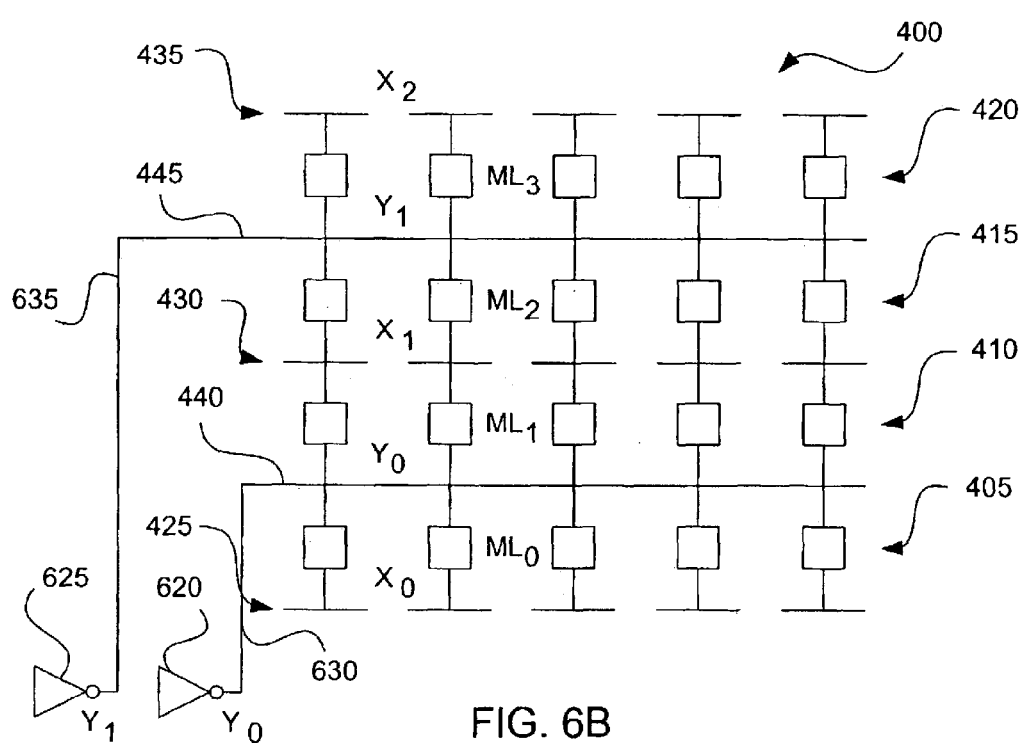
FIG. 6B depicts a schematic diagram of y-direction driver sets in conjunction with the stacked cross point memory of FIG. 4A.

FIG. 6B depicts y-direction driver sets 620 and 625 that are used to select specific y-direction conductive array lines in the y-direction conductive array line layers 440 and 445. The $Y_0$ driver set 620 uses a thru 630 that goes through one ILD layer 515 in order to connect with the $Y_0$ layer 440. The $Y_1$ driver set 625 uses a thru 635 that goes through three ILD layers 515, 520, and 525 in order to connect with the $Y_1$ layer 445.

Figure 7A:
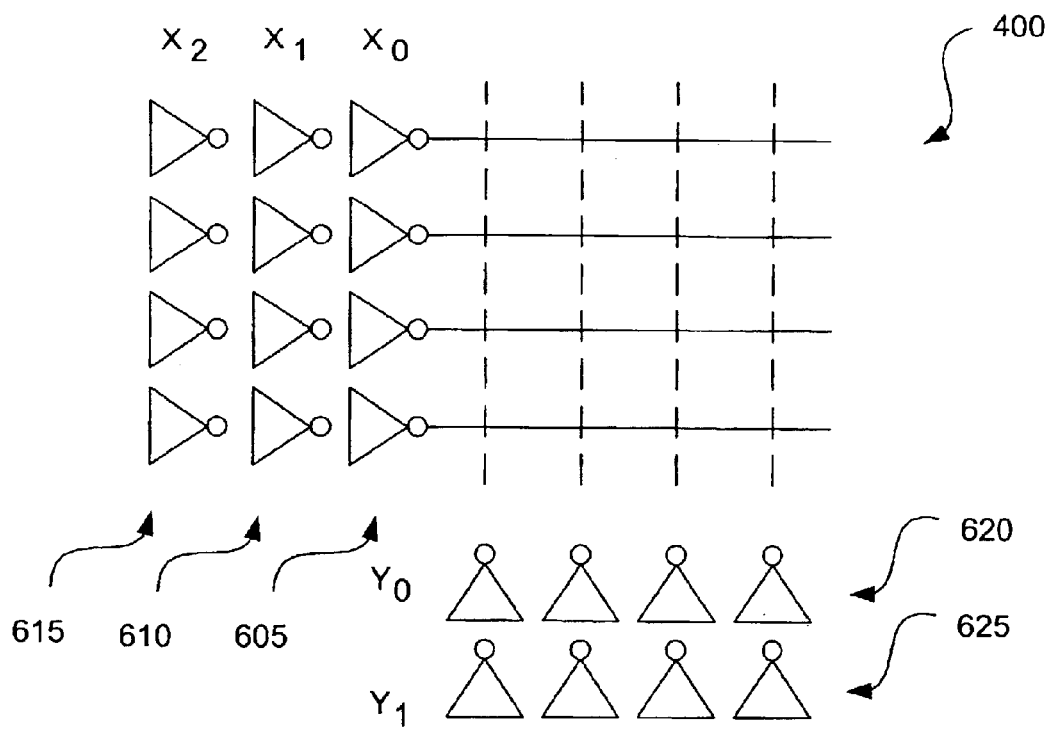
FIG. 7A depicts the general layout of the x-direction and y-direction driver sets depicted in FIGS. 6A and 6B in relation to the stacked cross point array depicted in FIG. 4A.
Figure 7B:
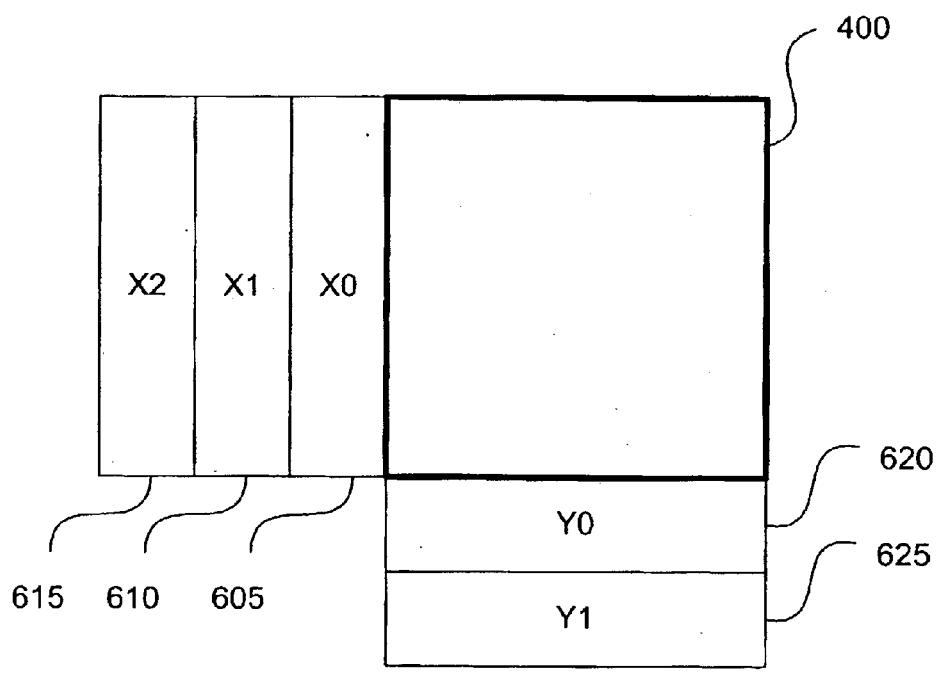
FIG. 7B depicts an abstracted representation of FIG. 7A.

FIG. 7A depicts the general layout of the x-direction and y-direction driver sets 605, 610, 615, 620, and 625 in relation to the stacked cross point array 400. FIG. 7B is a more abstracted representation of FIG. 7A. Since each driver set is on the same side the entire layout forms a non-symmetrical L-shape.

However, certain designs may interdigitate the driver circuitry so that the driver that controls one conductive array line comes from one side and the driver that controls the next conductive array line comes from the opposite side.

Interdigitated Driver Sets

Figure 8A:
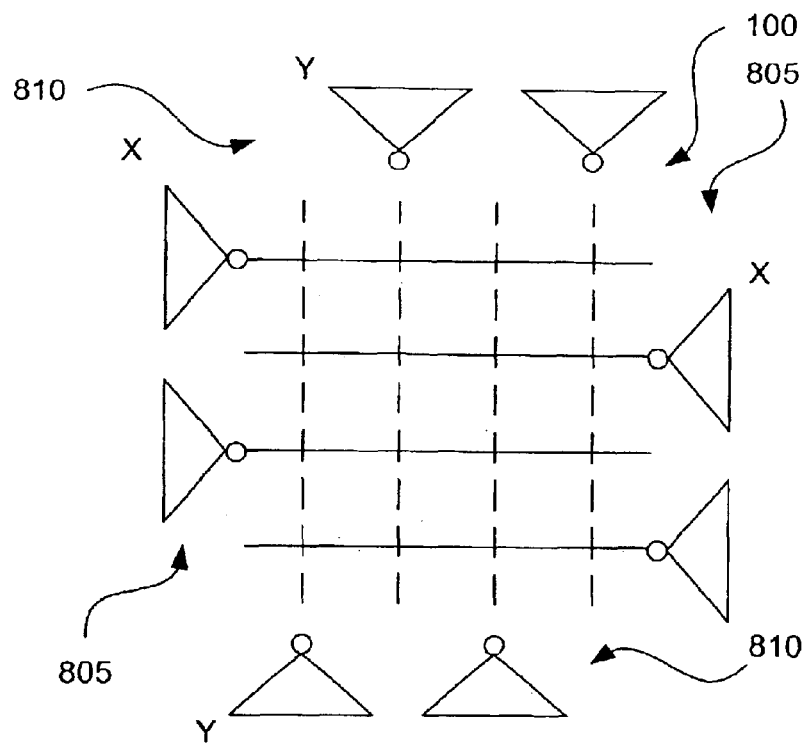
FIG. 8A depicts the general layout of interdigitated x-direction and y-direction driver in relation to the single layer cross point array depicted in FIG. 1.
Figure 8B:
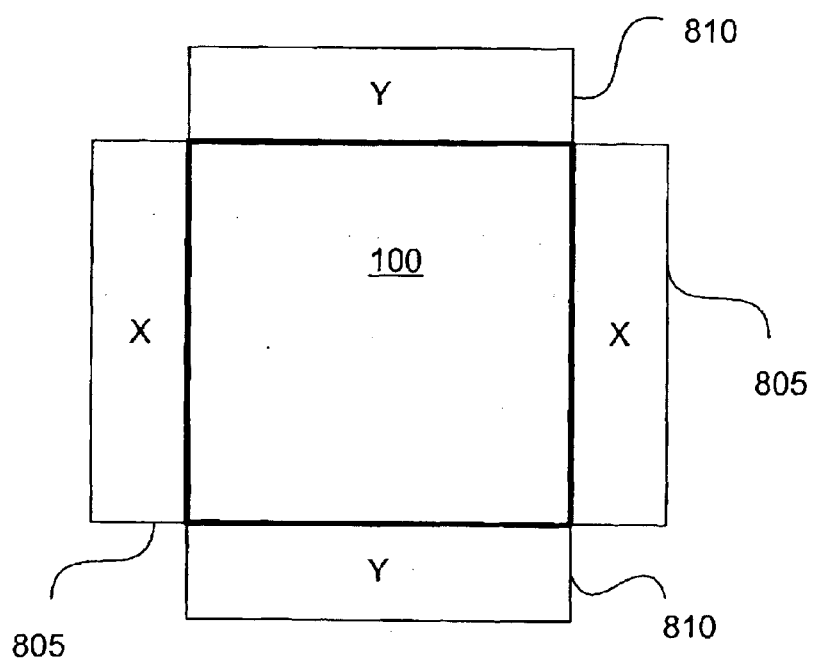
FIG. 8B depicts an abstracted representation of FIG. 8A.

FIGS. 8A and 8B depict a layout of an interdigitated x-direction driver 805 and an interdigitated y-direction driver 810 that drive a single-layer cross point array 100. Interdigitating the drivers 805 and 810 not only allows for greater symmetry in a single-layer cross point array 100, but also permits the drivers to be fabricated to thicker dimensions. Interdigitation can additionally be used for stacked cross point arrays.

Drivers can be considered to be interdigitated when alternating lines in the same conductive array line layer are driven from different locations. For example, even numbered lines can be driven from one side and odd numbered lines can driven from the opposite side. Conductive array lines can also be interdigitated in groups, for example having Such oppositely driven lines may be alternate, i.e. alternately a line driven from one side and a line driven from the other side, or grouped by pair, where 2 lines driven from one side are adjacent and two lines driven from the other side are next to them, or grouped in any arrangement which allows the use of a driver which is laid out in the pitch of 2×N cells, and drives N lines. By extension, we call "interdigitated driver set" a set of drivers driving interdigitated lines even though the drivers themselves are not interdigitated.

Figure 9A:
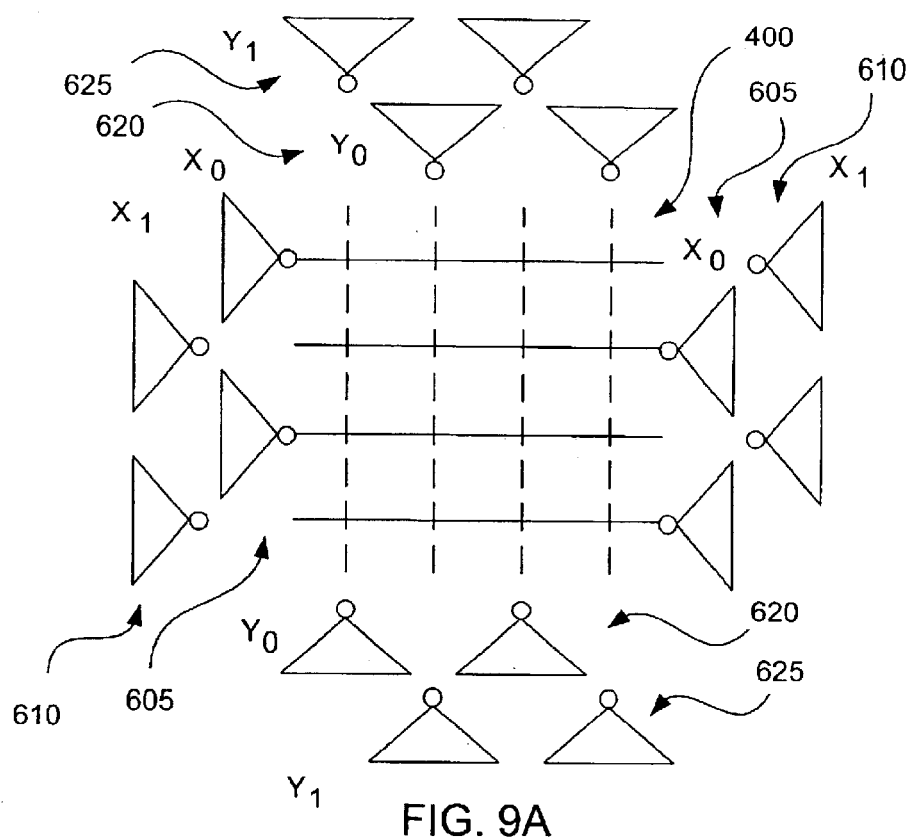
FIG. 9A depicts the general layout of interdigitated x-direction and y-direction driver in relation to the stacked cross point array depicted in FIG. 4A.
Figure 9B:
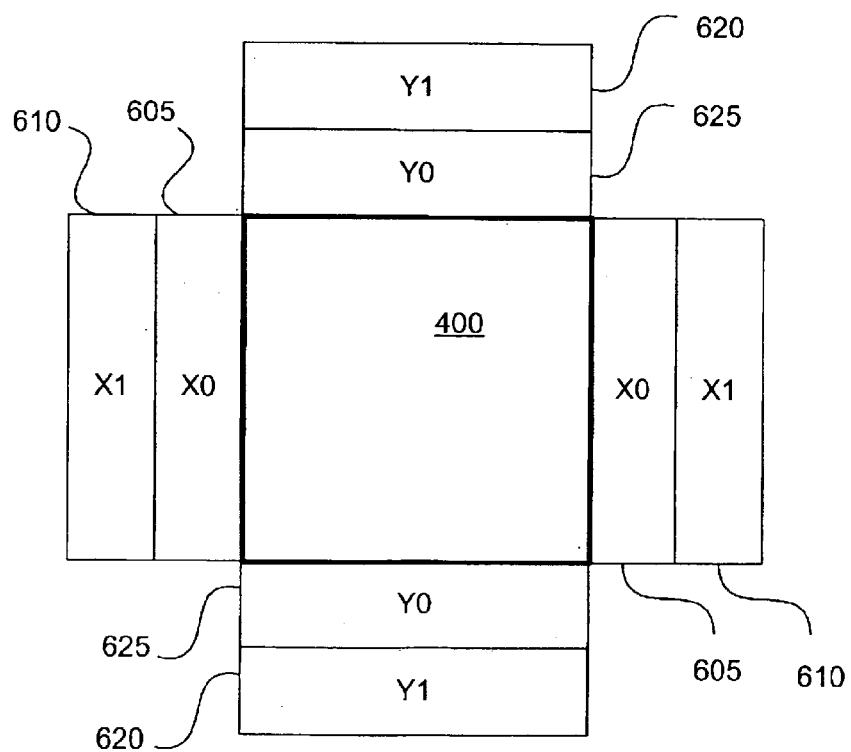
FIG. 9B depicts an abstracted representation of FIG. 8A.
Figure 10A:
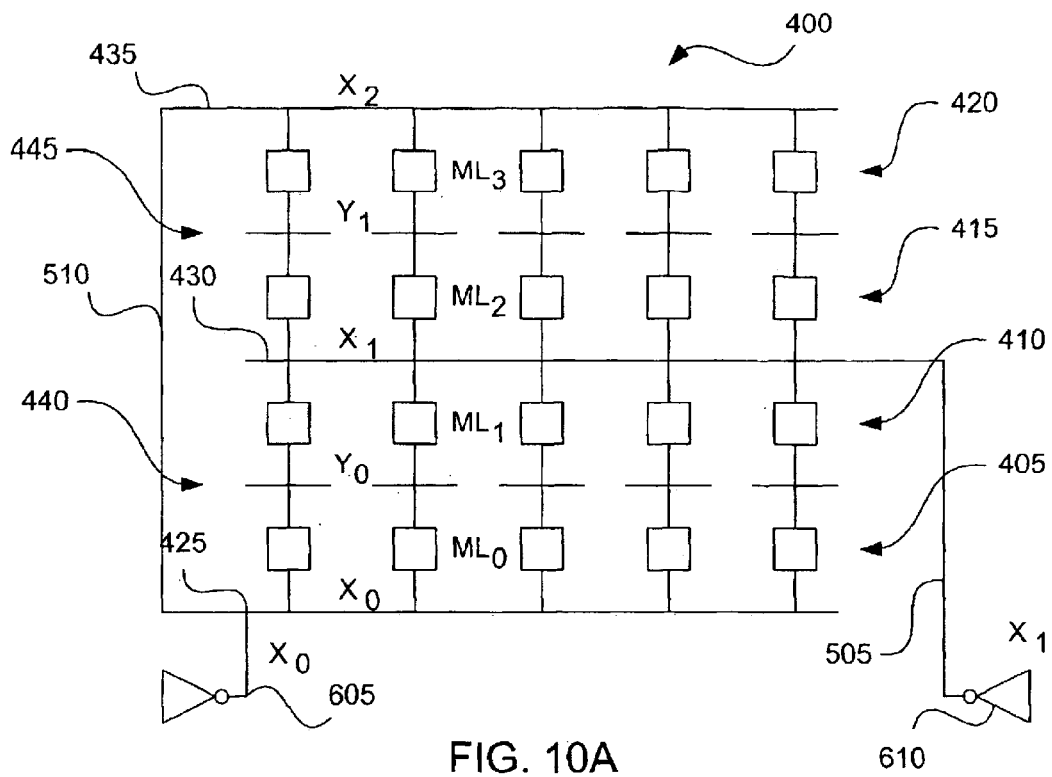
FIGS. 10A and 10B depicts a schematic diagram of alternating x-direction driver sets in conjunction with the stacked cross point memory of FIG. 4A.
Figure 10B:
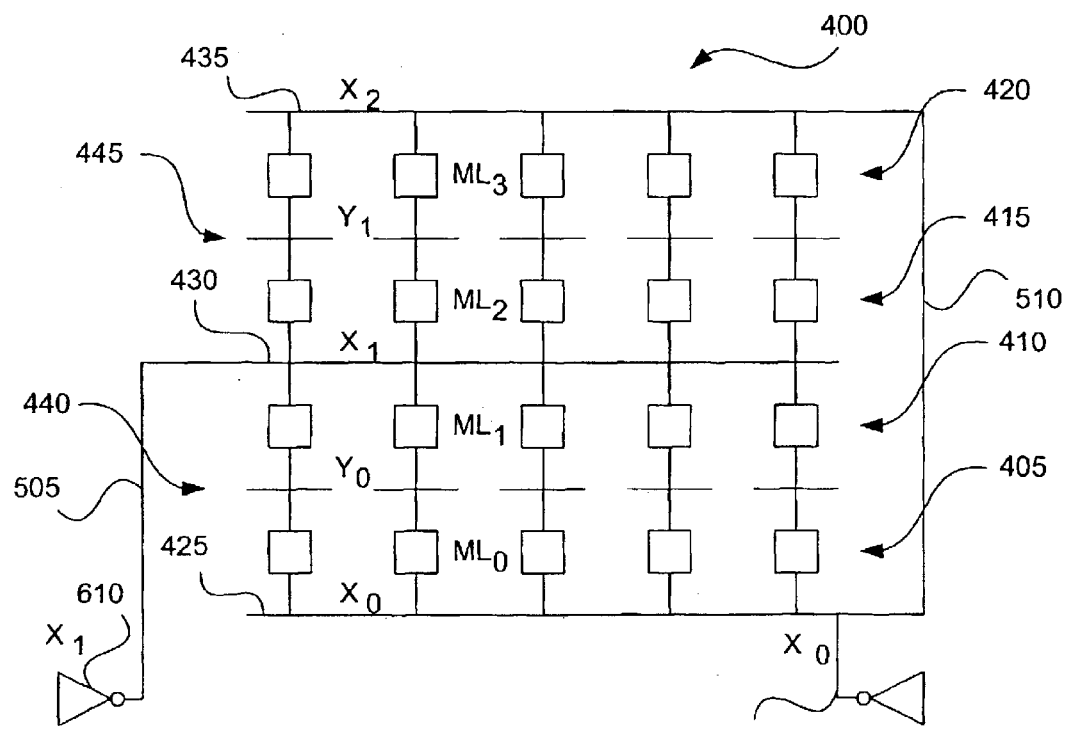

FIGS. 9A and 9B depict a layout of driver sets 605, 610, 620, and 625 for the stacked cross point array 400 that are interdigitated. The configuration of the x-direction driver sets 605 and 610 are depicted in figures 10A and 10B. The configuration of FIG. 10A is alternated with the configuration of FIG. 10B for each x-direction conductive array line so that both the $X_0$ driver 605 and the $X_1$ driver 610 alternate sides.

Additionally, by placing the thru 505 that connects the $X_1$ layer 430 to the $X_1$ driver 610 and thru 510 that connects the $X_2$ layer 435 to the $X_0$ driver 605 on opposite sides, the bottom $X_0$ layer 425 can be directly tied to the $X_2$ layer 435. Therefore, a single $X_0$ driver 605 can be used for both the bottom $X_0$ layer 425 and the top $X_2$ layer 435.

The layouts shown in FIGS. 7B, 8B and 9B assume that the drivers 605, 610, 615, 620, 625, 805, and 810 all lie outside the cross point array 100 or 400. However, if the substrate underneath the cross-point array 100 or 400 is used to draw the peripheral circuitry, the footprint of the entire memory chip can be reduced.

Figure 11A:
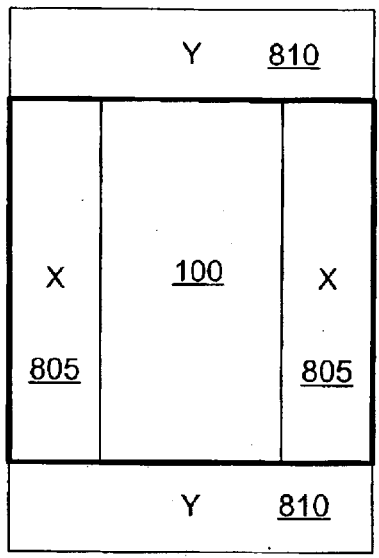
FIGS. 11A through 11C depict various layouts of the x-direction and y-direction driver sets that have some drivers underneath the single-layer cross point array depicted in FIG. 1.
Figure 11B:
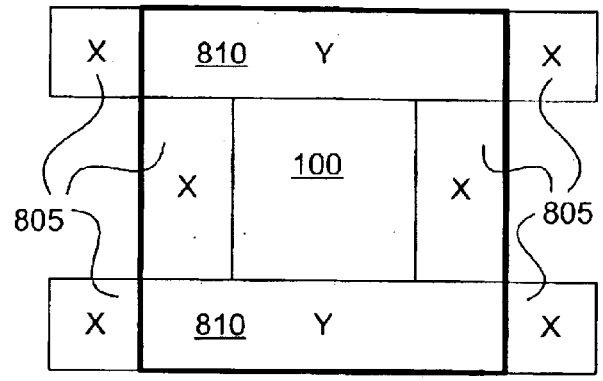
Figure 11C:
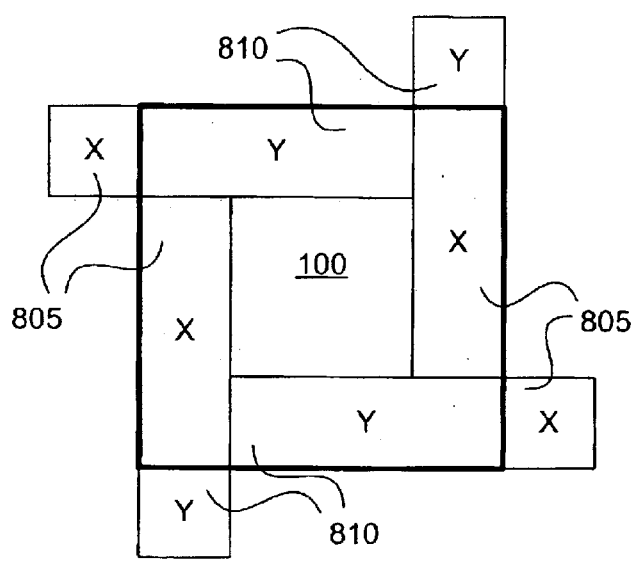

FIGS. 11A through 11C depict various layouts of the x and y direction driver sets 805 and 810 that have some drivers underneath the single-layer cross point array 100. In each layout, some drivers are left outside of the single-layer cross point array 100 even though there may be unused space underneath the cross point array 100. In FIG. 11A the layout forms a rectangle that extends beyond the cross point array 100 in the x-direction. In FIG. 11B the layout forms an H-shape that extends beyond the cross point array 100 in the y-direction. In FIG. 11C the layout forms a spiral shape that, while extending beyond the cross point array 100 in both the x-direction and y-direction, forms a more symmetrical pattern.

Figure 12:
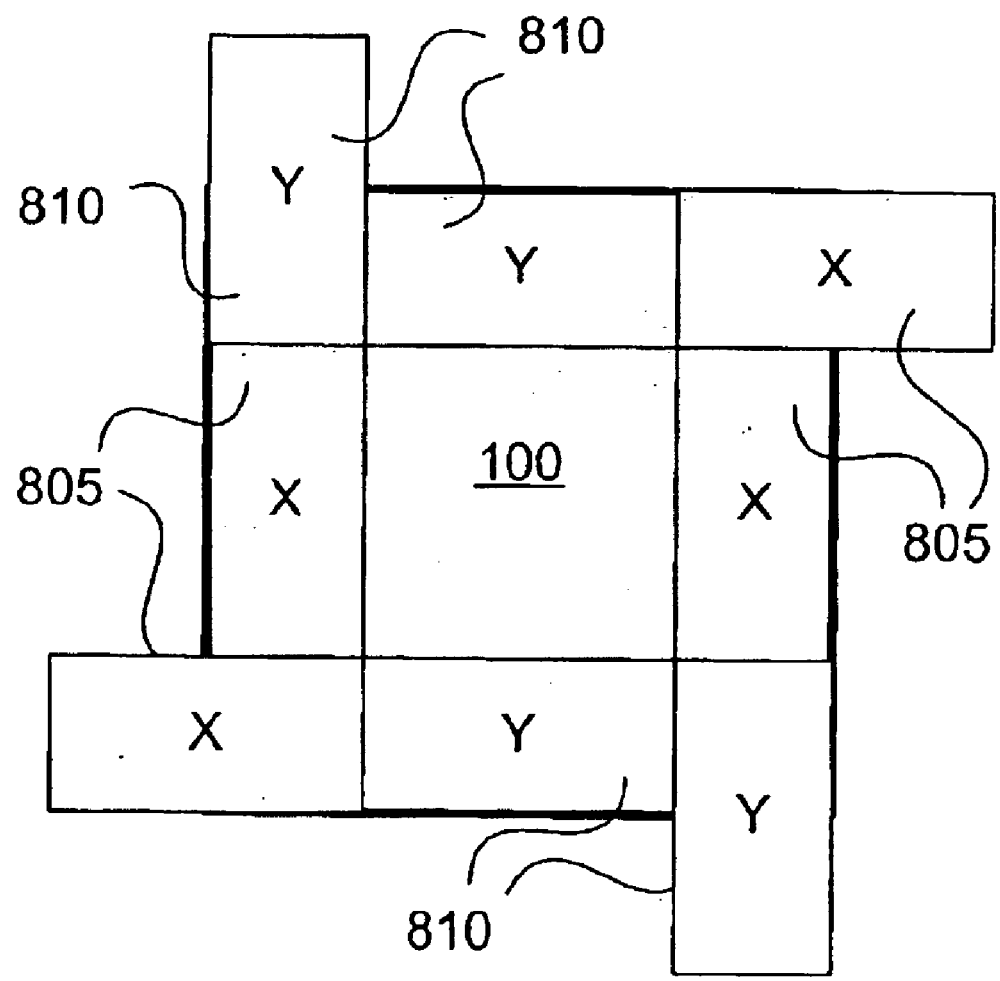
FIG. 12 depicts a layout of the x-direction and y-direction driver sets that interdigitate some drivers but not others such that some drivers are underneath the single-layer cross point array depicted in FIG. 1.

FIG. 12 depicts an alternative layout of the x and y direction driver sets 805 and 810 that interdigitate some drivers but not others. Portions of each driver set 805 and 810 are still outside the single-layer cross point array 100. However, assuming each driver is fabricated to common dimensions, a portion of the non-interdigitated driver would still extend beyond the cross point array 100, because non interdigitated drivers drive twice as many lines in the same pitch, and therefore necessitate more circuitry.

However, if none of the drivers 805 and 810 are interdigitated, then the entire peripheral circuitry might be placed underneath the single-layer cross point array 100, as shown in the following paragraphs.

Non-Interdigitated Driver Sets

Figure 13A:
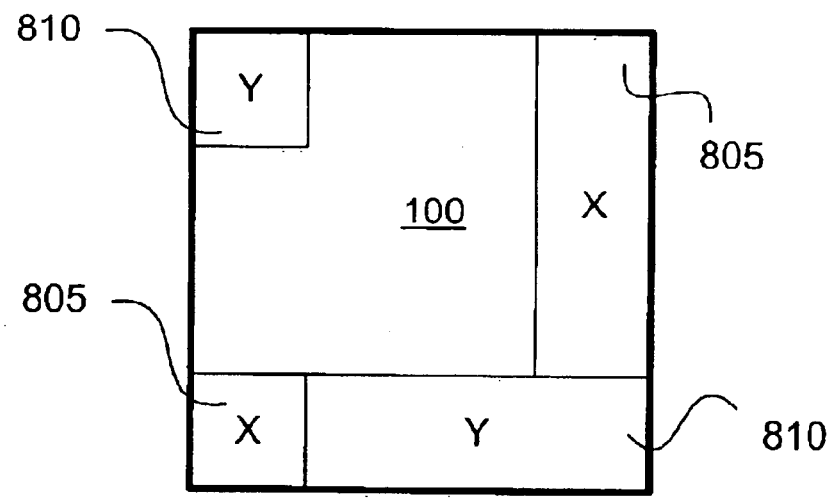
FIG. 13A depicts a layout of an x-direction driver set and a y-direction driver set that completely fits underneath the single-layer cross point array depicted in FIG. 1.
Figure 13B:
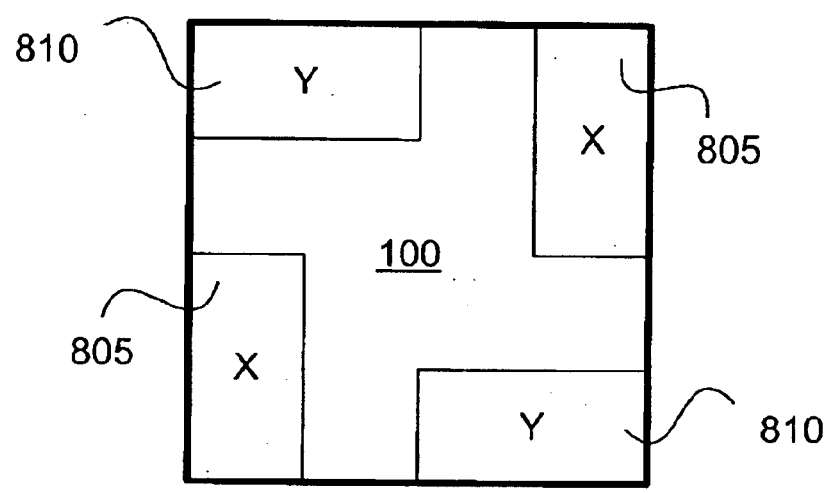
FIG. 13B depicts another layout of an x-direction driver set and a y-direction driver set that completely fits underneath the single-layer cross point array depicted in FIG. 1.

FIG. 13A depicts a layout of an x-direction driver 805 and a y-direction driver 810 that completely fits underneath the single-layer cross point array 100. FIG. 13B depicts an alternate layout of the x-direction driver 805 and the y-direction driver 810 that uses a more symmetrical layout.

Figure 14A:
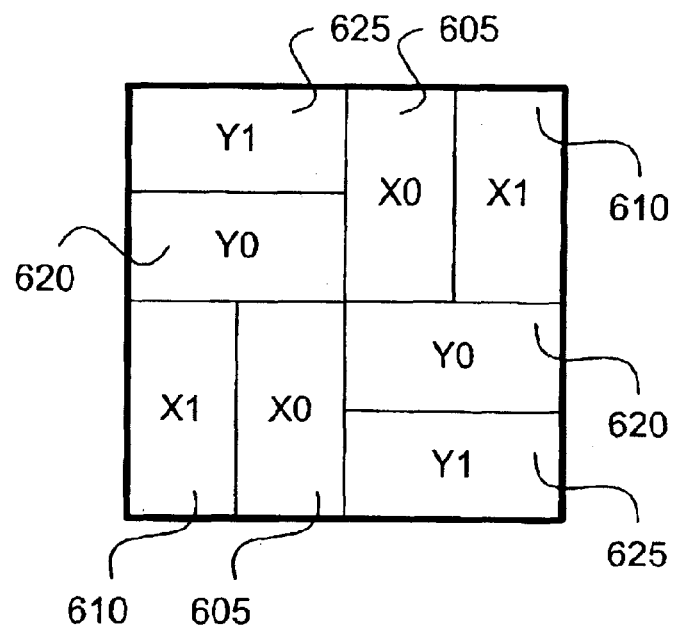
FIG. 14A depicts a layout of x-direction driver sets and a y-direction driver sets that completely fits underneath the stacked cross point array depicted in FIG. 4A.
Figure 14B:
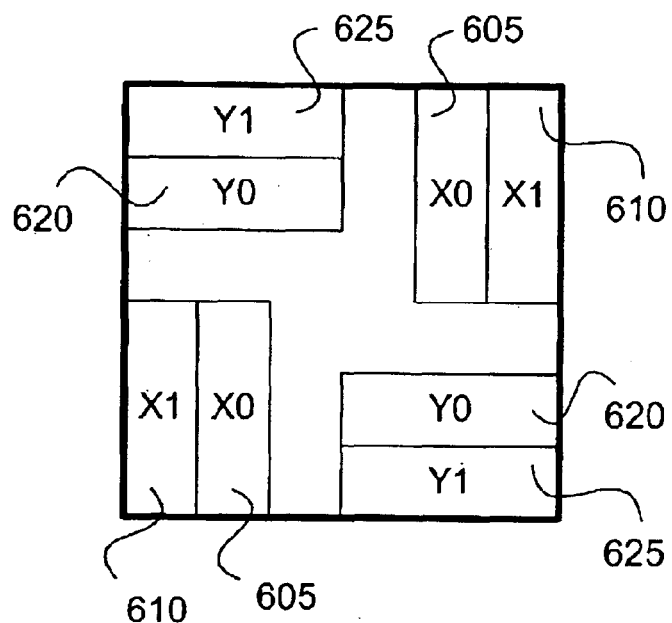
FIG. 14B depicts a layout of x-direction driver sets and a y-direction driver sets that leaves empty gaps underneath the single-layer cross point array depicted in FIG. 4A.

The concept of using non-interdigitated driver sets can be extended to stacked cross point arrays. FIGS. 14A and 14B depict layouts of non-interdigitated driver sets 605, 610, 620, and 625. It should be appreciated that each driver set 605, 610, 620, or 625, is not necessarily to scale, and, depending upon both the number of lines in each conductive array line layer and the circuitry used for each driver, each driver set 605, 610, 620, or 625, may completely fit underneath the stacked cross point array 400, or may leave empty gaps underneath the stacked cross point array 400, as shown in FIG. 14B.

Figure 15A:
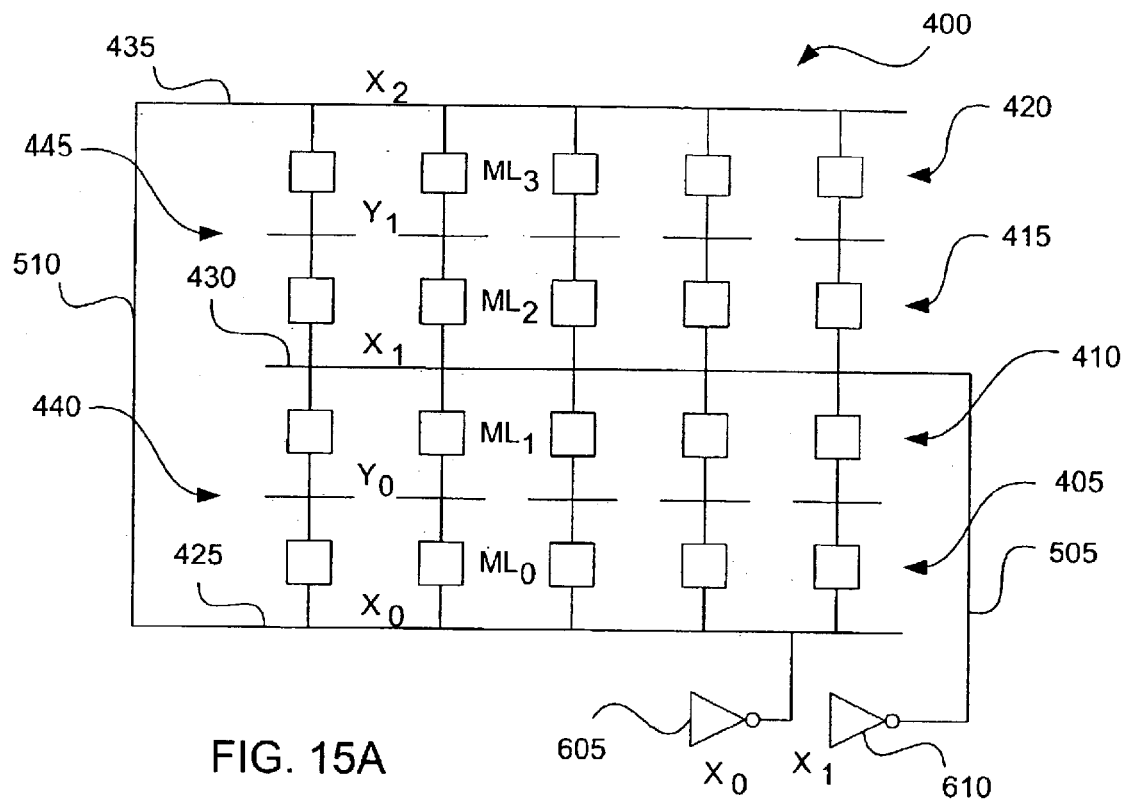
FIG. 15A depicts a schematic diagram of x-direction driver sets in conjunction with the stacked cross point memory of FIG. 4A.
Figure 15B:
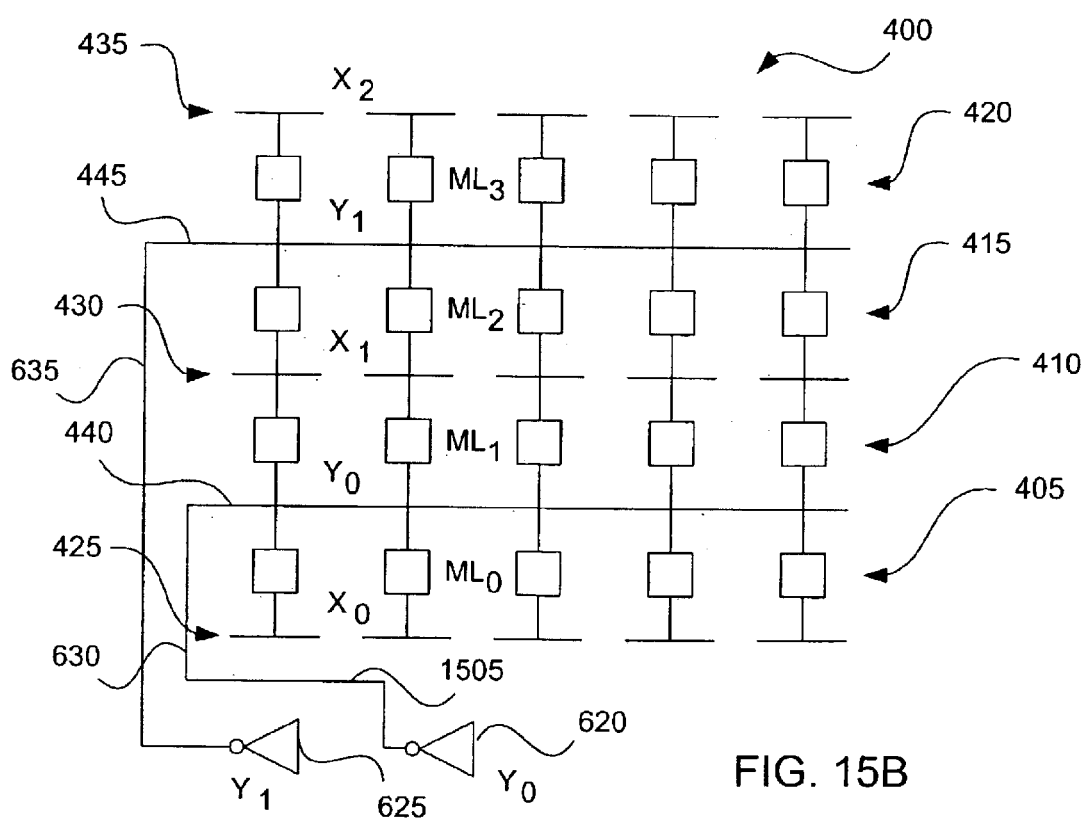
FIG. 15B depicts a schematic diagram of y-direction driver sets in conjunction with the stacked cross point memory of FIG. 4A.

FIGS. 15A and 15B depicts one possible configuration of the driver sets 605, 610, 620 and 625 that can be used in the layout of FIGS. 14A or 14B. While the $X_0$ driver set 605 can directly connect with the $X_0$ layer 425 (and the $X_2$ layer 435 via the thru 510) and the $X_1$ and $Y_1$ driver sets 610 and 625 can be directly connected to their $X_1$ and $Y_1$ layers 430 and 445 via their respective thrus 505 and 635, the $Y_0$ driver set 620 will not be able to directly connect to the thru 630 that connects the peripheral circuitry to the $Y_0$ layer 440. Instead, the $Y_0$ driver set 620 uses an extra metal layer 1505 in the peripheral circuitry portion in order to connect to the thru 630 by going over the circuitry of the $Y_1$ driver set 625. The extra metal layer 1505 is in addition to any metal layers that may be necessary to construct the driver circuitry.

Figure 16:
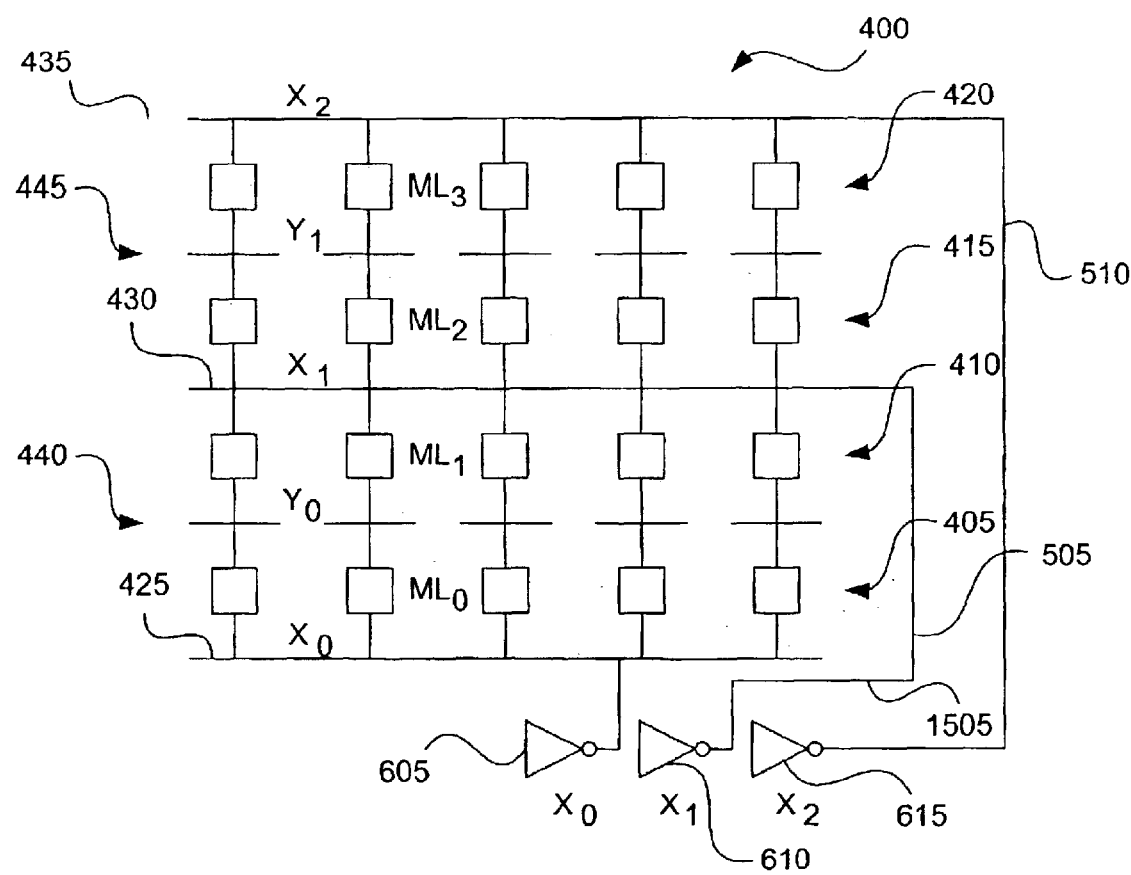
FIG. 16 depicts an alternative schematic diagram of x-direction driver sets in conjunction with the stacked cross point memory of FIG. 4A that uses separate drivers that operate on identical logic.

FIG. 16 depicts an alternate configuration for the x-direction driver sets 605, 610, and 615. Since the extra metal layer 1505 is used in connection with the y-direction drivers 620 and 625, the configuration of FIG. 15 also utilizes the extra metal layer 1505. By separating the $X_0$ driver set 605 from the $X_2$ driver set 615, the load on the $X_0$ driver is reduced even if the two drivers 605 and 615 use identical logic. This will improve the access time to layer 425 and 435.

Figure 17:
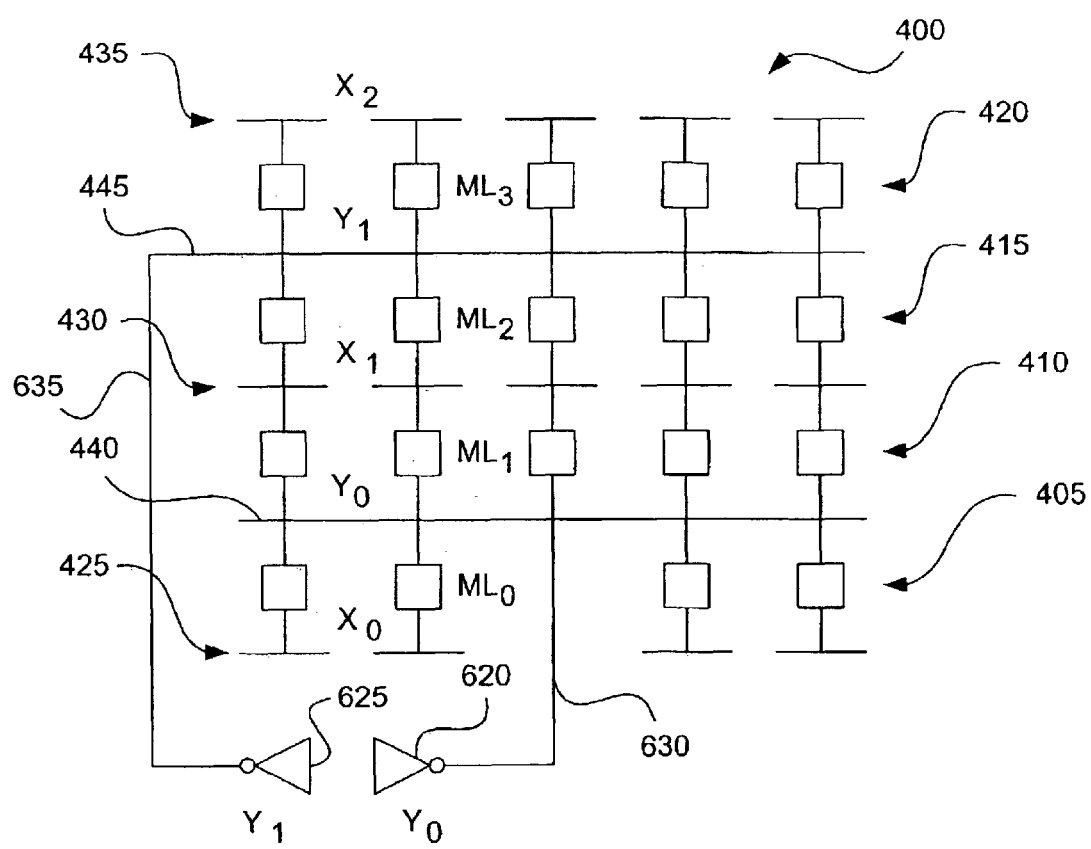
FIG. 17 depicts an alternative schematic diagram of y-direction driver sets in conjunction with the stacked cross point memory of FIG. 4A that eliminates the need for additional metal layers.

FIG. 17 depicts yet another configuration for the y-direction driver sets 620 and 625 that can be used to eliminate the need for the extra metal layer 1505. In this configuration, one x-direction conductive array line is eliminated from the $X_0$ layer 425, creating an array cut that allows the $Y_0$ driver set 620 to directly connect with the thru 630 that connects the $Y_0$ driver set 620 to the $Y_0$ layer 440. While one line of memory plugs would be eliminated from the $ML_0$ layer 405, their absence would represent a very small percentage of the total memory plugs in the stacked cross point array 400 and may be a fair tradeoff for a peripheral circuitry design that does not use an extra metal layer 1505. Cells in layers $ML_1$ 410, $ML_2$ 415, and $ML_3$ 420 straight above the eliminated $ML_0$ array line can either be eliminated, or be kept as non functional dummy cells. This way, the four array layers are symmetrical.

Additionally, if the $Y_0$ driver set 620 is moved to the middle of the stacked cross point array 400, the access time for the $Y_0$ layer 440 is improved. If the $Y_0$ driver set 620 is at one end of the conductive array lines then current would need to travel to the opposite end in order to reach the active memory cell in the worst case scenario. However, if the $Y_0$ driver set 620 is positioned in the middle of the conductive array lines, the current would only need to travel half the length of the conductive array line in the worst case scenario. Access time is, therefore, improved by having the $Y_0$ driver set 620 positioned in the middle of the conductive array lines.

Figure 18A:
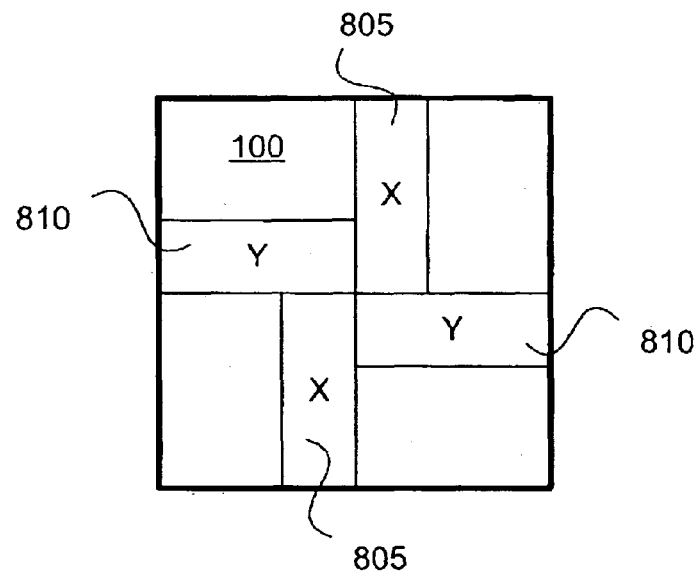
FIG. 18A depicts a layout of an x-direction driver set and a y-direction driver set that connects to the single-layer cross point array depicted in FIG. 1.

FIG. 18A depicts a layout of an x-direction driver 805 and a y-direction driver 810 that are both centered underneath the single-layer cross point array 100. The y-direction driver 810 can use the array cut to reach the middle of the y-direction conductive array lines 10 and the x-direction driver can be positioned anywhere under the x-direction conductive array lines 105 as long as it does not overlap with another driver. Moving both drivers 805 and 810 substantially to the middle of their respective conductive array lines 105 and 110 further reduces the access time to the memory plug layer 115.

Such a layout would be most effective for either a single layer cross point array or the bottom layer of a stacked cross point array. In the case of a stacked cross point array, while the $X_0$ driver set 605 and $Y_0$ driver set 620 are positioned substantially in the middle of cross point array 400, the other driver sets would typically connect to the ends of the conductive array lines for the upper conductive array line layers.

Figure 18B:
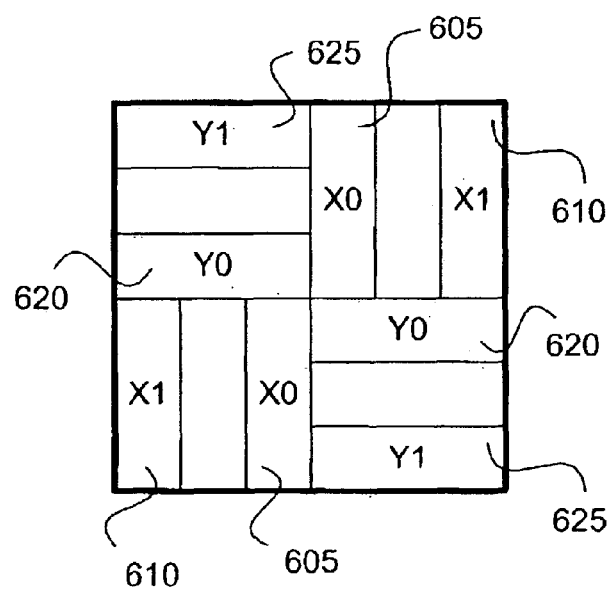
FIG. 18B depicts a layout of multiple x-direction driver sets and y-direction driver sets that connects to the stacked cross point array depicted in FIG. 4A.

FIG. 18B depicts a layout of driver sets for a stacked cross point array 400 where the bottom memory layer has a faster access time than upper memory layers. Certain applications might require that a portion of memory be accessed faster than other portions. For example a mass storage device might want to be able to access its file allocation tables (FAT) quicker than other stored data.

Non-Interdigitated Driver Design

Figure 19:
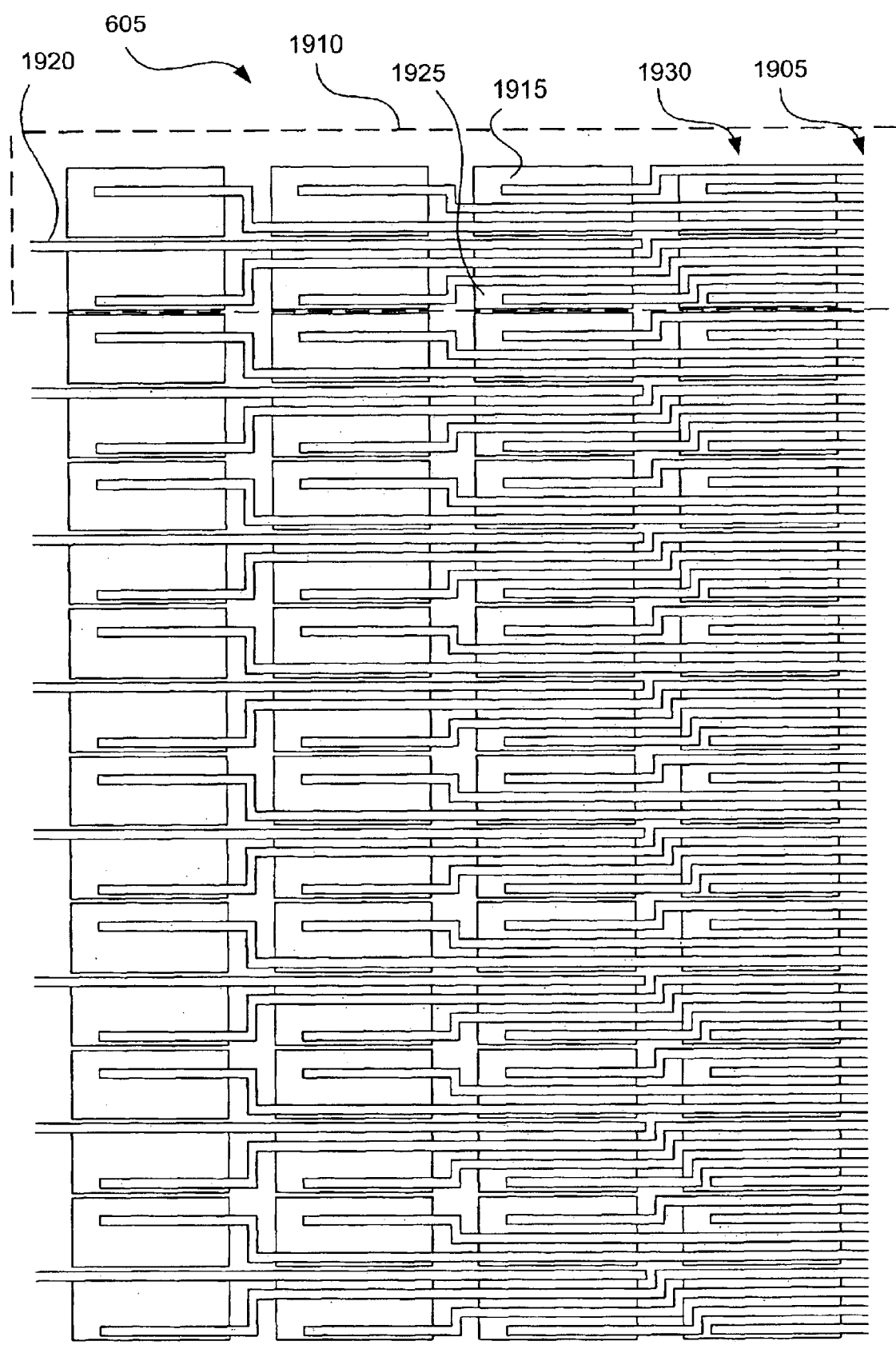
FIG. 19 depicts a layout of the X0 driver set that fit within the necessary line pitch.

However, the designs depicted in FIGS. 13A through 18B all presume that non-interdigitated drivers are used. FIG. 19 depicts one possible layout of the $X_0$ driver set 605 that would make it possible to fit the line drivers within the necessary line pitch. Each driver would be responsible for supplying voltage to a specific conductive array line (or group of conductive array lines if the driver set supplied voltage to multiple memory layers). Therefore, if there were 256 conductive array lines on the $X_0$ layer 425, there would be 256 drivers in the $X_0$ driver set 605. The drivers deliver voltage to the conductive array lines through metal interconnects 1905. Each metal interconnect 1905 would preferably be fabricated to be the same width as the conductive array lines. Although each driver in FIG. 19 spans four metal interconnects, stacking the drivers four deep ensures that the entire $X_0$ driver set 605 fits within the required parameters. In general terms, if a line driver group contained N line drivers, and if a memory cell was fabricated to a width of W, then the line driver group could not have a width greater than N×W if the drivers were to fit completely underneath the cross point array.

It should be appreciated that additional peripheral circuitry may be needed in addition to the drivers. For example, the drivers might require access to both a primary decoder and a secondary decoder, as described in copending application Ser. No. 10/330,965, filed Dec. 26, 2002, which has already been incorporated by reference. The primary decoder is capable of selecting a single group of, for example, eight drivers 1910 (but not a specific driver) and the secondary decoder is capable of selecting a single driver 1915 (but not a specific group of eight drivers 1910). Although the secondary decoder connections are not shown, the primary decoder activates the group of eight drivers through a metal interconnect line 1920. If the primary decoder selected a group of, say, sixteen drivers, then the metal interconnect line 1920 could be tied to a metal interconnect line of another set of eight drivers. The secondary decoder would then select a single driver out of the group of sixteen drivers. If there was room underneath the cross point array (e.g., the configuration shown in FIG. 14B), at least some of the additional peripheral circuitry could be placed underneath the cross point array.

Figure 20A:
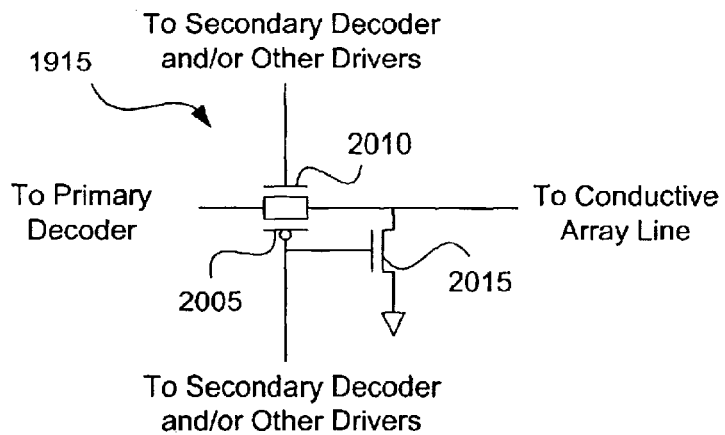
FIG. 20A depicts a driver schematic in which the driver requires access to a primary decoder, a secondary decoder, and a reference voltage.

FIG. 20A depicts one possible driver schematic in which the driver 1915 requires access to a primary decoder, a secondary decoder, and ground. The driver 1915 is made up of a pass device (one p-channel transistor 2005 and one n-channel transistor 2010) and a transistor 2015 to ground. The transistor to ground 2015 can be either an n-channel transistor or a p-channel transistor, depending upon how it is connected to the pass device.

Figure 20B:
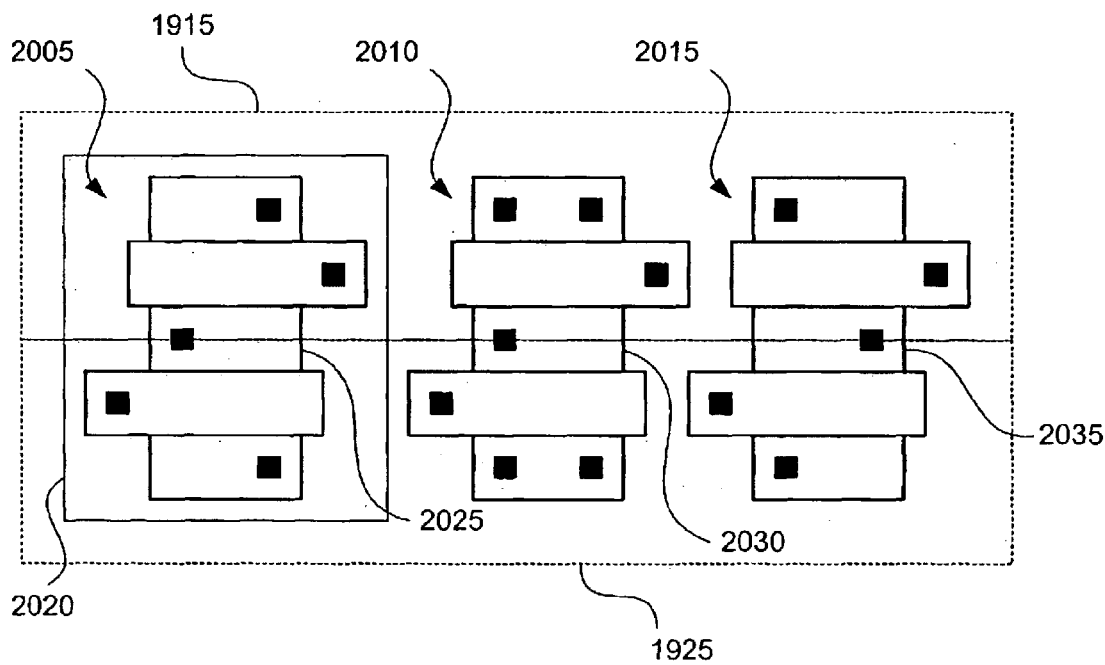
FIG. 20B depicts a layout of the three transistors depicted in FIG. 20A.

FIG. 20B depicts one layout of the three transistors 2005, 2010, and 2015 that make up the driver 1915. Since one of the transistors 2005 of the pass device is a p-channel transistor, it must be fabricated in a portion of the semiconductor substrate that is p-doped 2020. In order to conserve space, each transistor 2005, 2010, and 2015 shares a node 2025, 2030, and 2035 with a transistor from another driver 1925 in the group of eight drivers 1910. The nodes can be shared because the entire group of eight drivers 1910 receives the same input 1920 from the primary decoder into each pass device, and the third transistor in each driver is always tied to ground.

Figure 21A:
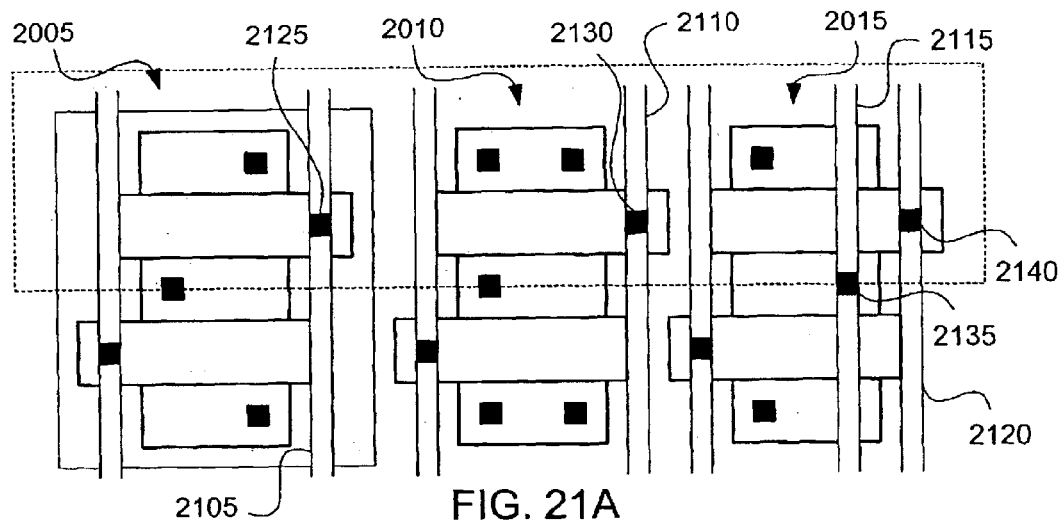
FIG. 21A depicts the driver depicted in FIG. 20B after a first metal layer is deposited.

Making the various connections can be accomplished through well-known process steps. FIG. 21A depicts the driver 1915 after a first metal layer is deposited that provides vertical connections 2105, 2110, 2115, and 2120 from the driver to other peripheral circuitry and/or other drivers. The transistor to ground 2015 can share its vertical connection 2115 to ground with every grounded transistor in the same horizontal position as the drivers 1915 and 1925. However, in order to reduce load alternative layouts may not tie all the drivers together. Similarly, the gates of each transistor 2005, 2010 and 2015 in the driver 1915 that takes inputs from the secondary decoder can share their vertical connections 2105, 2110, and 2115 with the gates of other drivers that have the same position in relation to the group of eight drivers 1910. Although not shown in FIG. 21A, the gate of the grounded transistor 2015 and the gate of the p-channel transistor 2005 are driven by the same input from the secondary decoder as shown in FIG. 20A.

Although a single via 2125, 2130, 2135, and 2140 is shown connecting each of the transistors 2005, 2010, and 2015 to their corresponding vertical connections 2105, 2110, 2115, and 2120, it should be appreciated that multiple vias might be used in order to improve performance. Similarly, different designs might use vertical connections 2105, 2110, 2115, and 2120 that are wider than a single feature size in order to similarly improve performance.

Figure 21B:
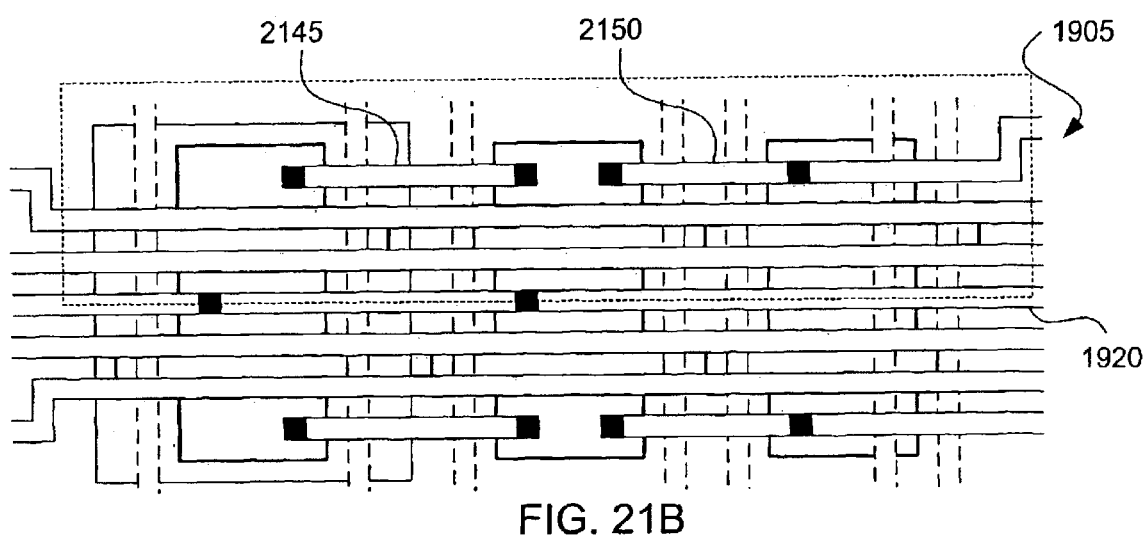
FIG. 21B depicts the driver depicted in FIG. 21 A after a second metal layer is deposited.

FIG. 21B depicts the driver 1915 after a second metal layer is deposited. The second metal layer provides the horizontal connections 2145, 2150, and 1920 that make the logical connections between the three transistors 2005, 2010, and 2015. The transistors 2005 and 2010 in the pass device arc tied together with two horizontal connectors 2145 and 1920. Additionally, the horizontal connector 1920 that connects the nodes 2025 and 2030 of the pass device that is common to the two drivers 1915 and 1925 extends beyond the driver 1915 boundaries to the other drivers in the group of eight drivers 1910 and carries signals from the primary decoder.

Horizontal connector 2150 also connects the transistor to ground 2015 to the pass device transistors 2005 and 2010. In one embodiment, connector 2145 and connector 2150 are the same line, ensuring that all three transistors 2005, 2010, and 2015 are tied together. The horizontal connector 2150 is preferably the same line pitch as the conductive array lines because the horizontal connector 2150 is the beginning of the metal interconnect that joins the driver 1915 to the appropriate conductive array line. The other metal interconnects from the other drivers in the group of eight drivers 1910 are also formed on the second metal layer. Although other embodiments could use more metal layers, such designs would typically result in a more costly fabrication process.

Figure 22:
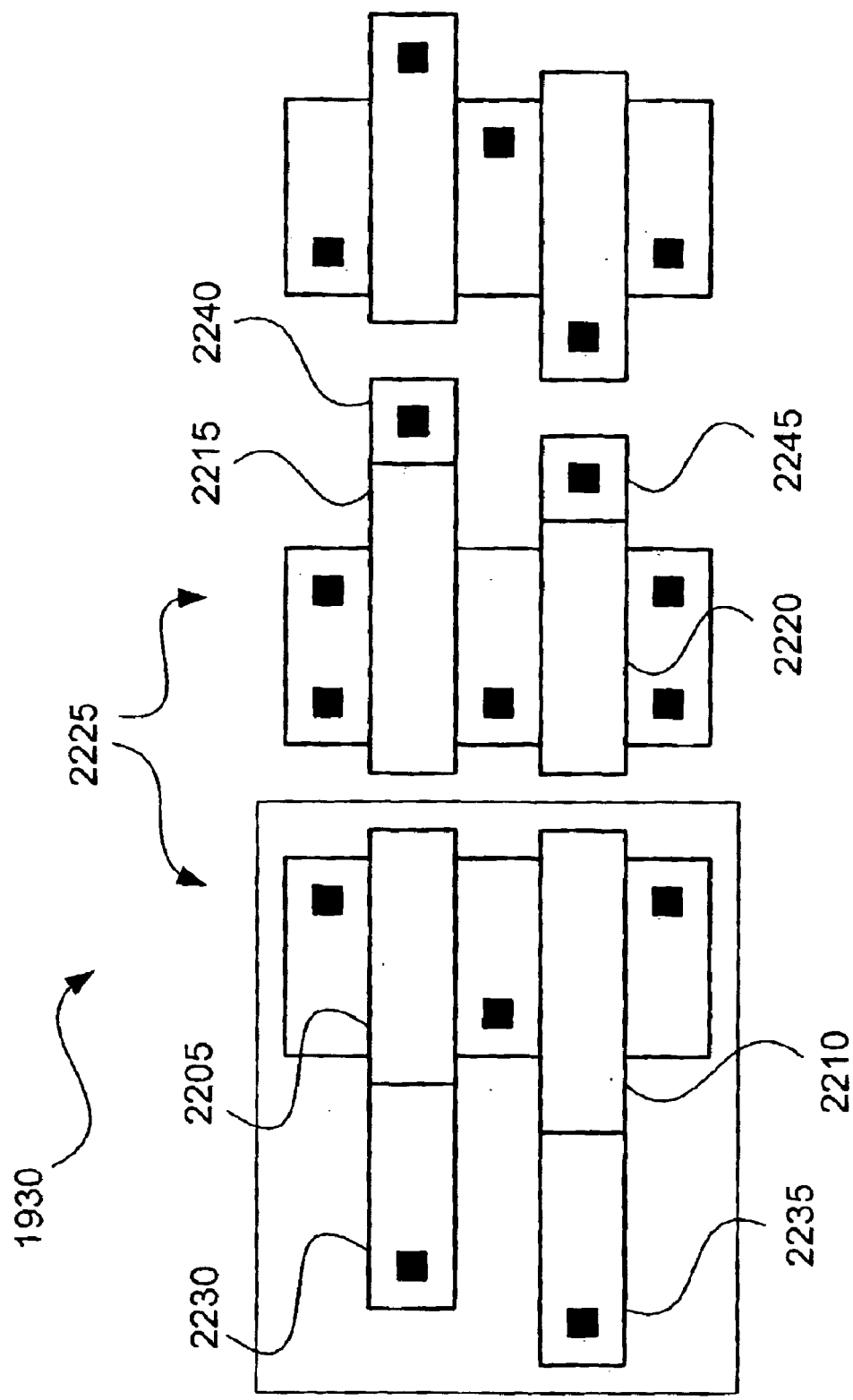
FIG. 22 depicts a layout of the last stage of drivers.

The last stage 1930 uses a slightly different layout than the previous three stages. Since the circuitry is laid out in the pitch of 8 array lines, which is intended to be minimum pitch, and the circuitry drives 8 conductive array lines, there is no space left for the line 1920 that drives the common nodes of the pass device. FIG. 22 depicts the layout for the last stage 1930 of drivers. The gates 2205, 2210, 2215, and 2220 of the pass device 2225 are lengthened with extensions 2230, 2235, 2240, and 2245. Although lengthening the pass device 2225 increases the width of the last stage 1930, such lengthening allows for the first metal layer to be used for both horizontal and vertical connections within the pass device 2225

Figure 23A:
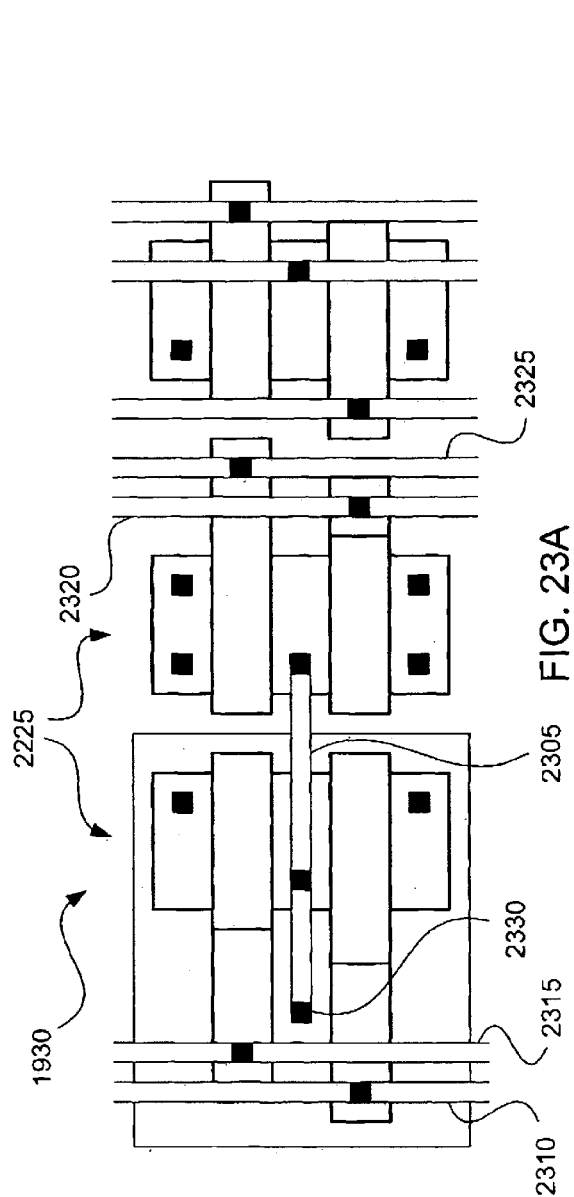
FIG. 23A depicts the driver depicted in FIG. 22 after a first metal layer is deposited.

FIG. 23A depicts the last stage 1930 after a first metal layer is deposited. A horizontal connector 2305 can directly connect the common node of the pass device 2225 because the vertical connections 2310, 2315, 2320, and 2325 lie on the exterior of the pass device 2225. Additionally, the horizontal connector 2305 extends to the beginning of a via 2330, which is how the last stage 1930 receives its input 1920 from the primary decoder.

Figure 23B:
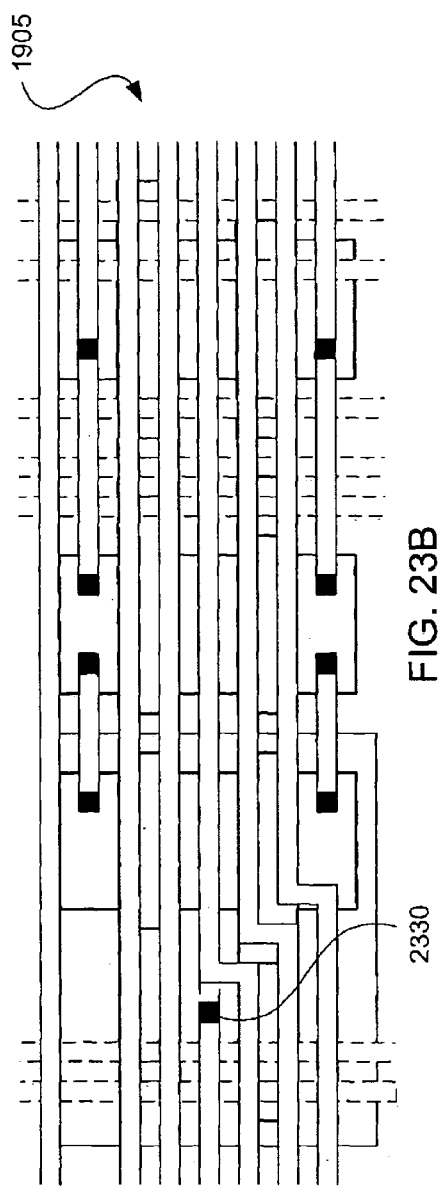
FIG. 23B depicts the driver depicted in FIG. 23A after a second metal layer is deposited.

FIG. 23B depicts the last stage 1930 after the second metal layer is deposited. The input 1920 from the primary decoder delivers its signal to the pass device 2225 through the via 2330, which connects to the horizontal connection 2305 on the first metal layer. Allowing the primary decoder input 1920 to drop to the first metal layer makes an additional line available on the second metal layer, such that all eight metal interconnects 1905 from the group of eight drivers 1910 fit on the minimum line pitch.

Concluding Remarks

Figure 24:
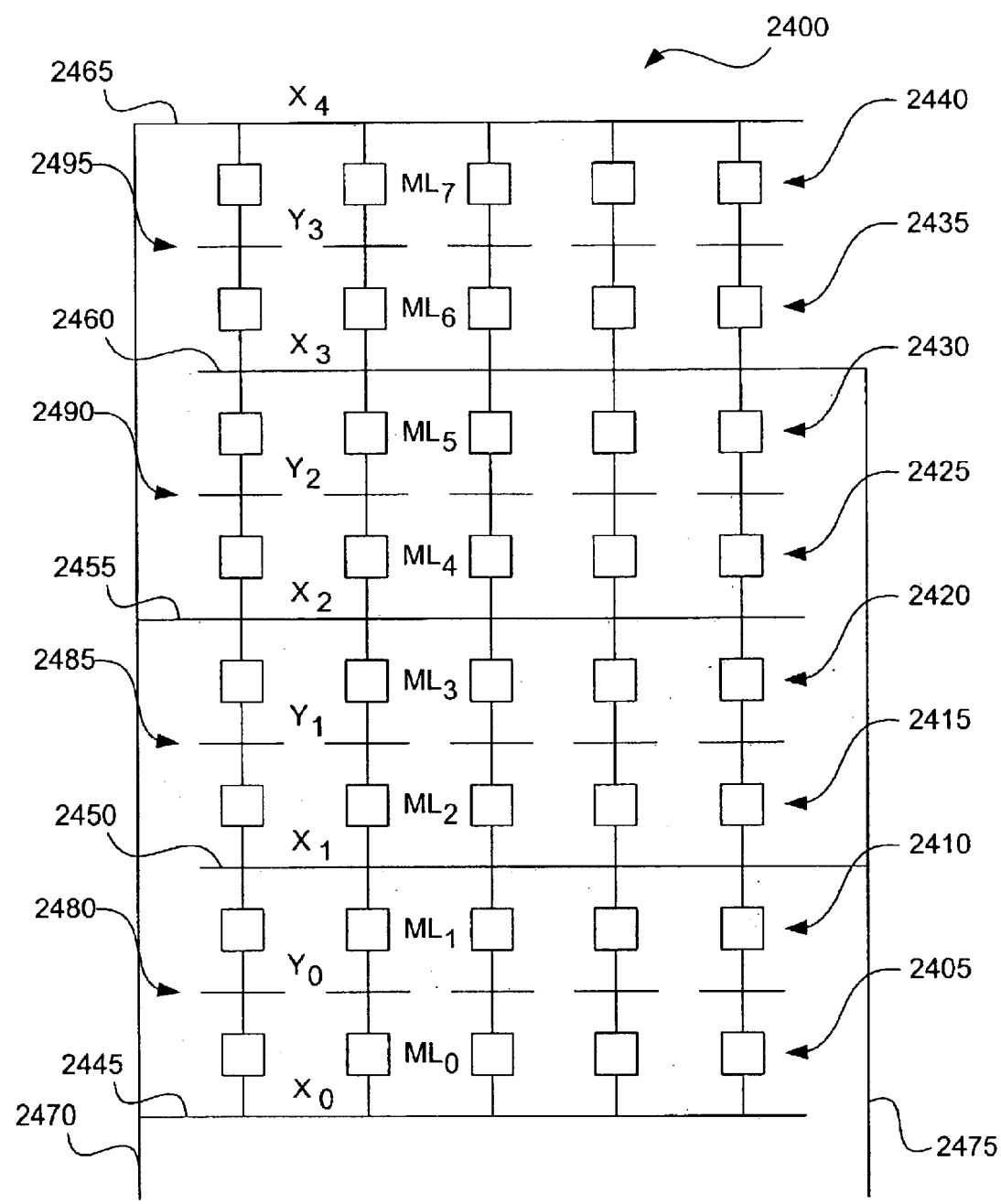
FIG. 24 depicts a schematic diagram of a stacked cross point memory array employing eight layer of memory.

Although the invention has been described in its presently contemplated best mode, it is clear that it is susceptible to numerous modifications, modes of operation and embodiments, all within the ability and skill of those familiar with the art and without exercise of further inventive activity. For example, the proceeding description largely described a stacked cross point array 400 with four memory layers, the concepts can be applied to stacked cross point arrays with any number of memory layers. FIG. 24 depicts a configuration of a stacked cross point array 2300 that uses eight memory layers 2405, 2410, 2415, 2420, 2425, 2430, 2435, and 2440. All of the x-direction conductive array line layers 2445, 2450, 2455, 2460, and 2465 are connected to one of two thrus 2470 or 2475, and, therefore, share decoding logic. Each of the y-direction conductive array line layers 2480, 2485, 2490, and 2495, however, are driven by their own decoding logic. Table 2 shows the combinations of x-direction conductive array lines and y-direction conductive array lines that are necessary to activate a memory element on a specific memory layer.

TABLE 2

| $X_0, X_2, X_4$ | $X_1, X_3$ | $Y_0$ | $Y_1$ | $Y_2$ | $Y_3$ | Memory Layer |
|---|---|---|---|---|---|---|
| x |   | x |   |   |   | $ML_0$ |
|   | x | x |   |   |   | $ML_1$ |
|   | x |   | x |   |   | $ML_2$ |
| x |   |   | x |   |   | $ML_3$ |
| x |   |   |   | x |   | $ML_4$ |
|   | x |   |   | x |   | $ML_5$ |
|   | x |   |   |   | x | $ML_6$ |
| x |   |   |   |   | x | $ML_7$ |

Accordingly, that which is intended to be protected by Letters Patent is set forth in the claims and includes all variations and modifications that fall within the spirit and scope of the claim.

What is claimed is:

1. A driver set for a cross point memory array comprising:
   a semiconductor substrate;
   a plurality of line driver groups formed on the substrate, each line driver group having N line drivers;
   a plurality of contiguous conductive lines, each conductive line electrically connected to both a line driver and a row of memory cells, each memory cell being fabricated to a width W;
   wherein the line driver group has a width that is not greater than N×W.

2. The driver set of claim 1, wherein:
   the plurality of conductive lines connect to a plurality of rows of memory cells such that the line driver groups are no wider than the plurality of rows of memory cells.

3. The driver set of claim 1, wherein:
   W is equal to the pitch of a conductive line, whereby the pitch is the minimum feature size added to the minimum spacing between features.

4. The driver set of claim 3, wherein:
   each row of memory cells is situated above the line driver that it is electrically connected to.

5. The driver set of claim 4, further comprising:
   no more than 2 levels of metallic interconnect between the line driver and the row of memory cells.

6. The driver set of claim 3, wherein:
   the plurality of conductive lines go in either a first direction or a second direction orthogonal to the first direction such that the conductive lines terminate at one of four line edges; and
   the line drivers are distributed over the four line edges.

7. The driver set of claim 1, wherein:
   N is equal to 8.

8. The driver set of claim 1, wherein:
   the width of the driver group is sufficient to contain at least one transistor, whereby any additional transistors that cannot be contained within the width are stacked lengthwise and do not contribute to the width of the driver group.

9. The driver set of claim 8, wherein:
   the width of the driver group is sufficient to contain at least a pair of transistors.

10. The driver set of claim 9, wherein:

pairs of transistors share a common node.

11. The driver set of claim 10, wherein:

transistors that share a common node are electrically connected to separate conductive lines.

12. The driver set of claim 11, wherein:

the common nodes of some transistor pairs in the driver group are electrically connected to other peripheral circuitry; and the common nodes of the remaining transistor pairs in the driver group are electrically connected to a reference voltage.

13. The driver set of claim 12, wherein:

the other peripheral circuitry is a primary decoder, whereby the primary decoder is responsible for selecting a driver group.

14. The driver set of claim 12, wherein:

the reference voltage is ground voltage.

15. The driver set of claim 11, wherein:

three transistor pairs constitute two line drivers in a line driver group.

16. Circuitry for a cross point memory array comprising:

a plurality of line driver groups that are stacked in a first direction, each line driver group having N line drivers that control N contiguous lines, each line driver being in one of N positions;

a primary decoder that is electrically connected to the plurality of line driver groups and is capable of selecting a single line driver group from the plurality of line driver groups;

a secondary decoder that is electrically connected to the plurality of line driver groups and is capable of selecting all the line drivers that are in a selected position from among the N positions; and a memory array that is electrically connected to the plurality of line driver groups via the N contiguous lines in each line driver group;

wherein the size of the plurality of line driver groups in the first direction is less than or substantially the same as the size of the memory array in the first direction.

17. The circuitry of claim 16, wherein:

the circuit is used in re-writable memory.

18. The circuitry of claim 16, wherein:

the memory array has memory plugs that exhibit a non-linear resistive characteristic.

19. The circuitry of claim 18, wherein:

the resistive memory elements are formed from conductive metal oxides.

20. The circuitry of claim 16, further comprising:

a second plurality of line driver groups that are stacked in the first direction, each line driver group having N line drivers, each line driver being in one of N positions;

a second primary decoder that is electrically connected to the second plurality of line driver groups and is capable of selecting a single line driver group from the second plurality of line driver groups; and a second secondary decoder that is electrically connected to the second plurality of line driver groups and is capable of selecting all the line drivers of the second plurality of line driver groups that are in a selected position from the N positions;

wherein the memory array is electrically connected to the second plurality of line driver groups; and wherein the size of the memory array in the first direction is substantially the same as or greater than the sum of the size of the plurality of line driver groups in the first direction and the size of the second plurality of line driver groups in the first direction.

21. The circuitry of claim 16, further comprising:

an orthogonal plurality of line driver groups that are stacked in a second direction that is orthogonal to the first direction, each line driver group having M line drivers, each line driver being in one of M positions;

an orthogonal primary decoder that is electrically connected to the orthogonal plurality of line driver groups and is capable of selecting a single line driver group from the orthogonal plurality of line driver groups; and an orthogonal secondary decoder that is electrically connected to the orthogonal plurality of line driver groups and is capable of selecting all the line drivers of the orthogonal plurality of line driver groups that are in a selected position from the M positions;

wherein the size of the memory array in the second direction is substantially the same as or greater than the size of the orthogonal plurality of line driver groups in the second direction.

* * * * *

UNITED STATES PATENT AND TRADEMARK OFFICE
CERTIFICATE OF CORRECTION

PATENT NO. : 6,836,421 B2 Page 1 of 1
DATED : December 28, 2004
INVENTOR(S) : Darrell Rinerson et al.

It is certified that error appears in the above-identified patent and that said Letters Patent is hereby corrected as shown below:

Column 5,
Lines 58-61, replace "The additional materials might include a non-ohmic device, as is described in co-pending application "High Density NVRAM," U.S. application Ser. No. 10/360,005, filed Feb. 7, 2003, already incorporated by reference." with -- The additional materials might include a non-ohmic device. --.

Signed and Sealed this

Eleventh Day of April, 2006

JON W. DUDAS
*Director of the United States Patent and Trademark Office*